United States Patent [19]

Ohsawa

[11] Patent Number: 5,701,095
[45] Date of Patent: Dec. 23, 1997

[54] HIGH SPEED, LOW NOISE CMOS MULTIPLEXER WITH PRECHARGE

[75] Inventor: Takashi Ohsawa, Yokohama, Japan

[73] Assignee: Kabushiki Kaisha Toshiba, Kawasaki, Japan

[21] Appl. No.: 763,036

[22] Filed: Dec. 10, 1996

Related U.S. Application Data

[63] Continuation of Ser. No. 393,076, Feb. 23, 1995, abandoned.

[30] Foreign Application Priority Data

Feb. 25, 1994 [JP] Japan .................. 6-028593

[51] Int. Cl.⁶ ........................... H03K 19/0948
[52] U.S. Cl. .................. 327/410; 326/17; 326/28; 326/121
[58] Field of Search ............... 326/83, 112, 119, 326/121, 17, 26–27, 95, 98, 28, 45, 50; 327/407–410

[56] References Cited

U.S. PATENT DOCUMENTS

| | | |
|---|---|---|
| 4,280,212 | 7/1981 | Ransom et al. ............ 327/410 |
| 4,645,944 | 2/1987 | Uya ........................... 327/410 |
| 5,012,126 | 4/1991 | Feldbaumer et al. |
| 5,418,480 | 5/1995 | Hastie et al. ............... 327/408 |

FOREIGN PATENT DOCUMENTS

| | | |
|---|---|---|
| 0 593 152 | 4/1994 | European Pat. Off. |
| 0 615 251 | 9/1994 | European Pat. Off. |

*Primary Examiner*—Edward P. Westin
*Assistant Examiner*—Jon Santamauro
*Attorney, Agent, or Firm*—Banner & Witcoff, Ltd.

[57] ABSTRACT

A semiconductor integrated circuit device has a data selecting circuit connected to a first power supply terminal, a precharge circuit, connected to a second power supply terminal, for receiving a precharge signal, and a wiring line connected to a common connection point between the data selecting circuit and the precharge circuit. The data selecting circuit includes at least two, i.e., first and second data transmission circuits. A first input data signal and a first selecting signal are supplied to the first data transmission circuit. A second input data signal and a second selecting signal are supplied to the second data transmission circuit.

44 Claims, 27 Drawing Sheets

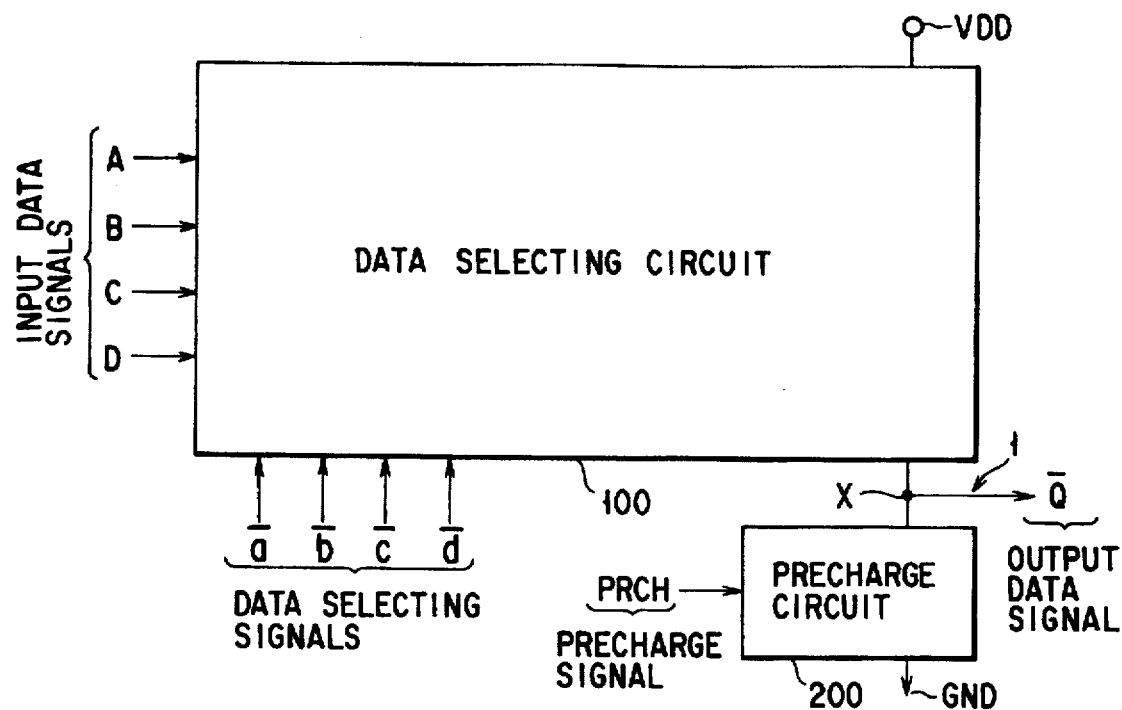
F I G. 3
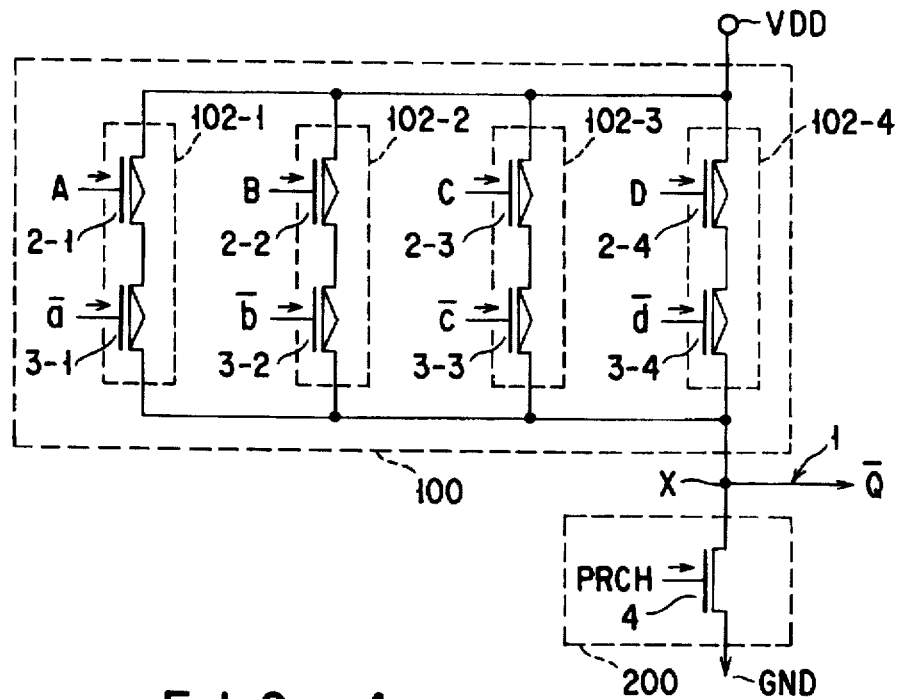
F I G. 4

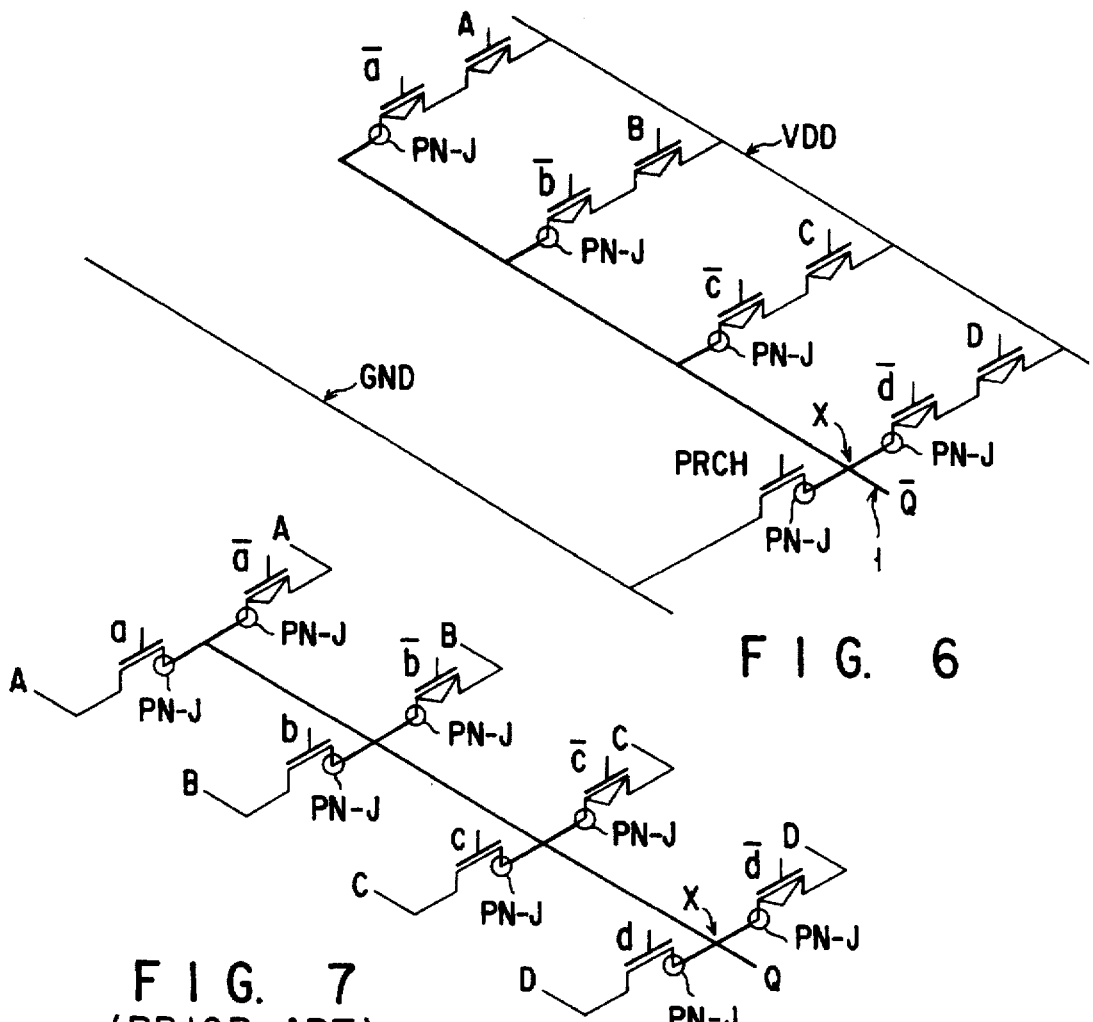
FIG. 6
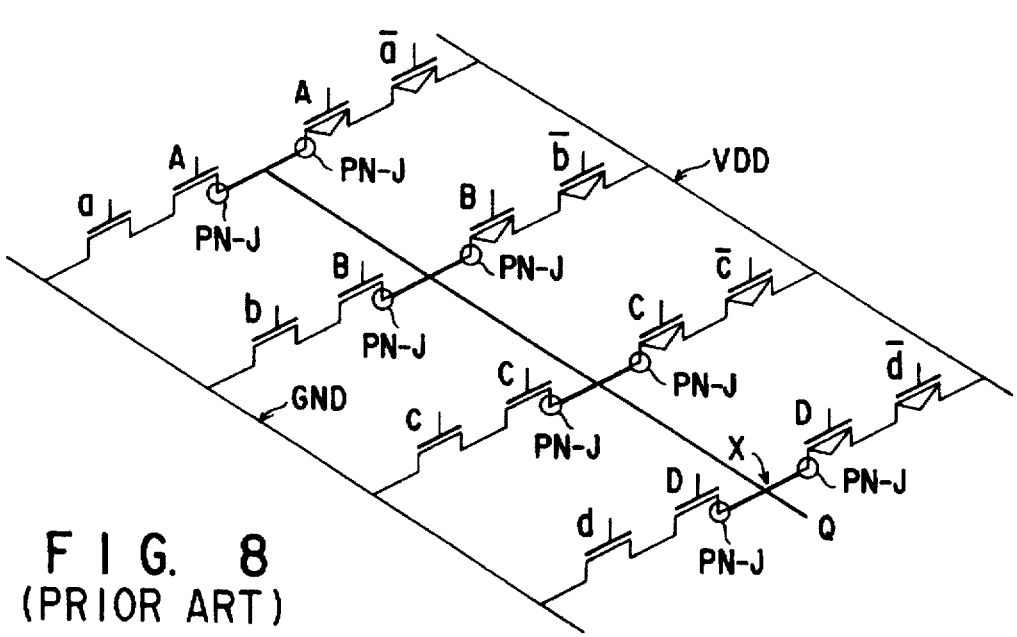
FIG. 7 (PRIOR ART)
FIG. 8 (PRIOR ART)

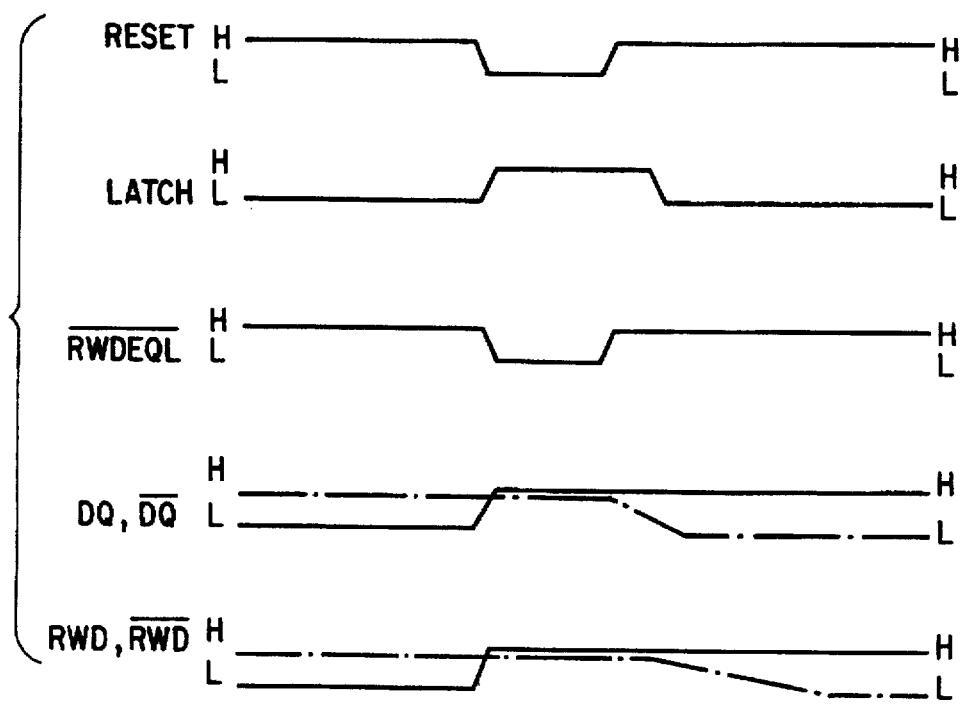
F I G. 13
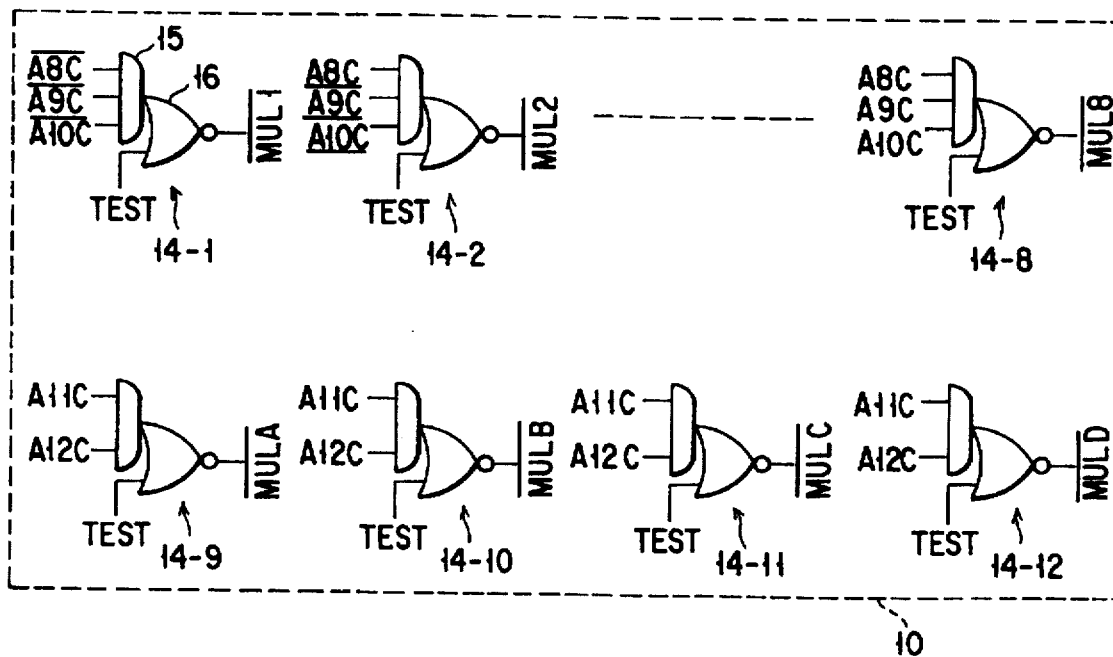
F I G. 15

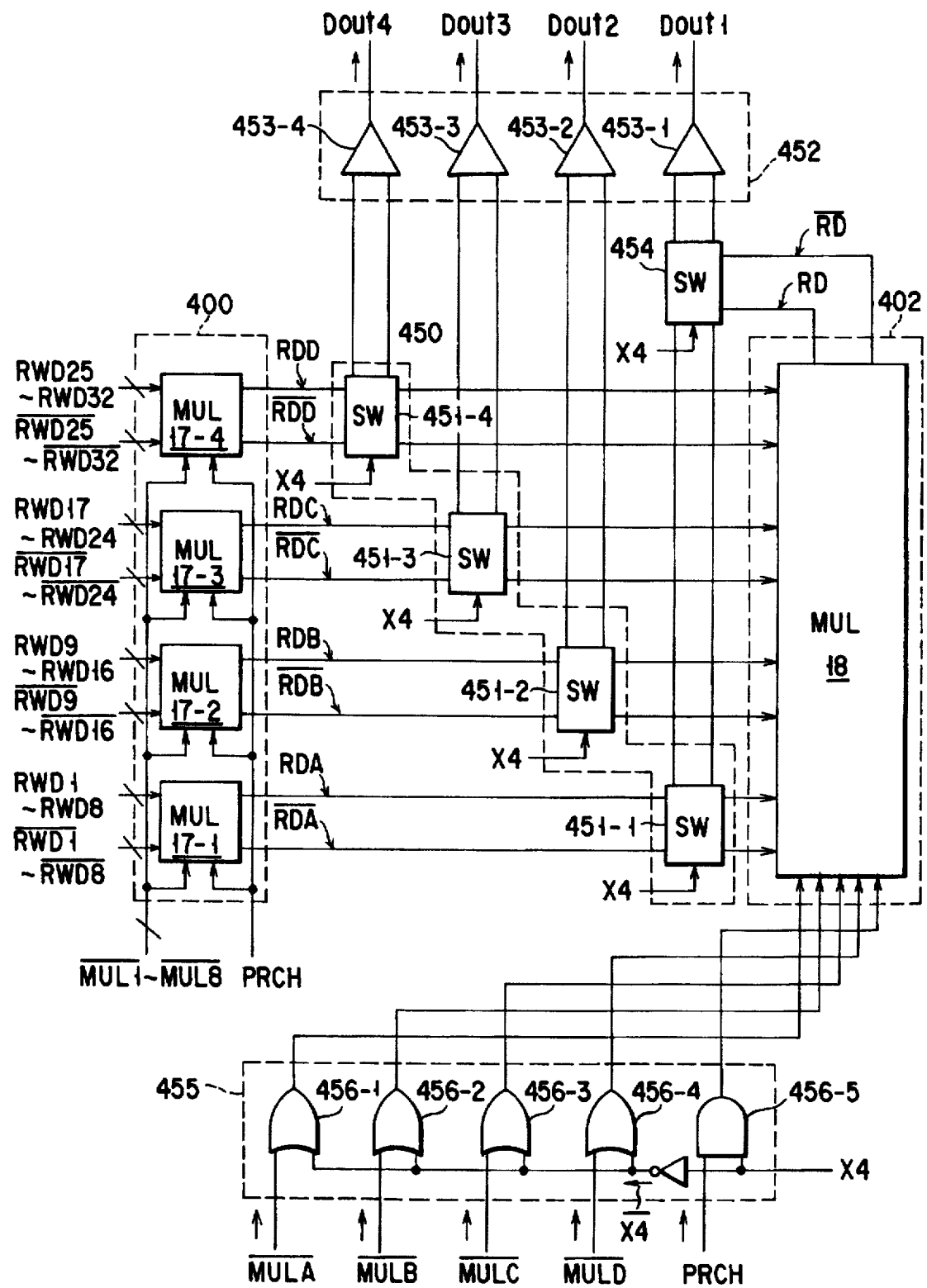
F I G. 19

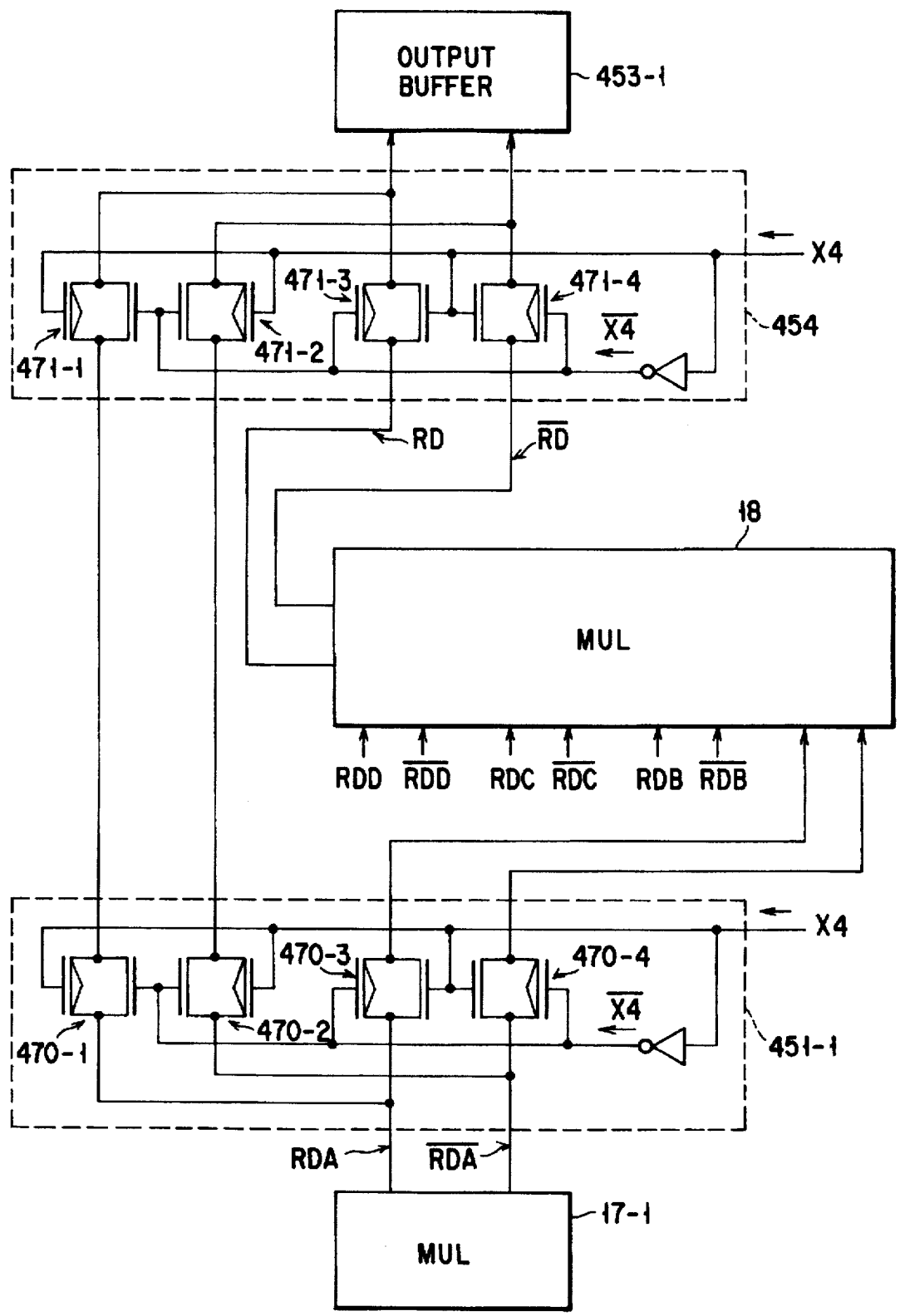
F I G. 20

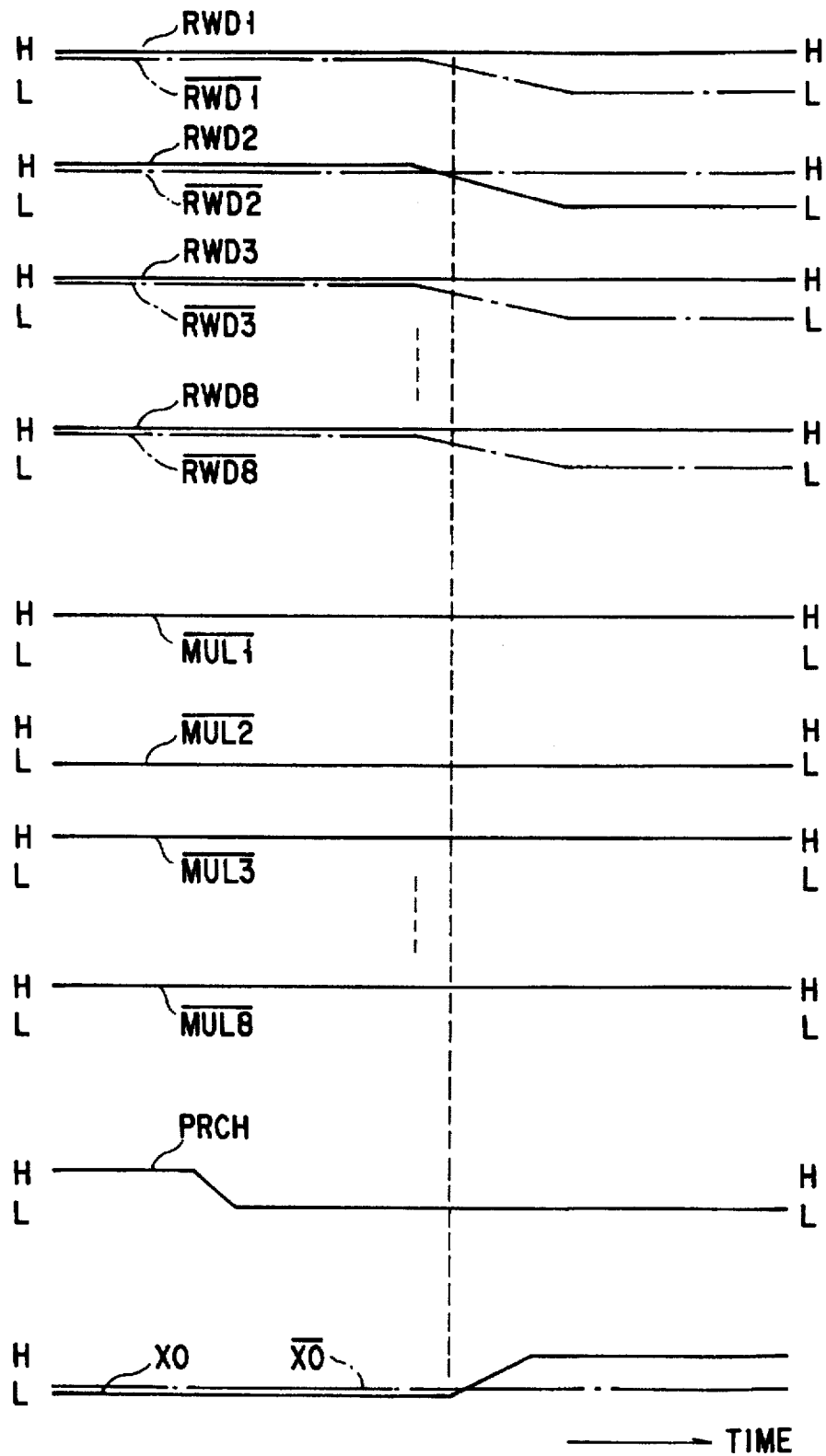
F I G. 21

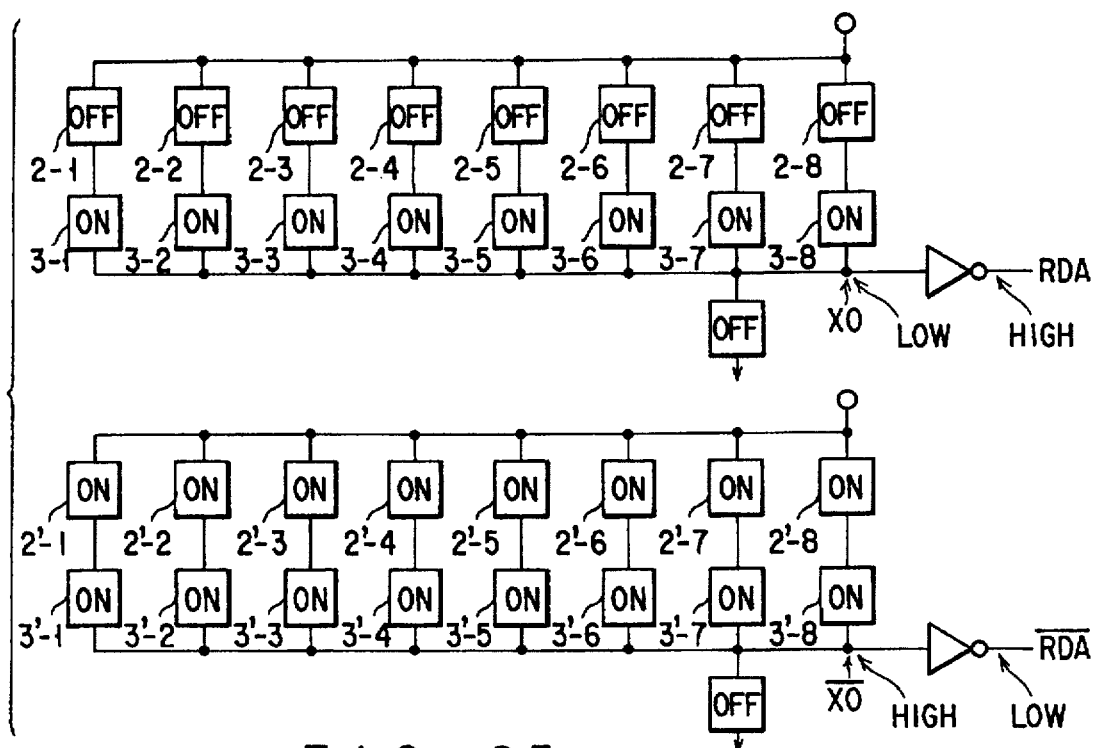
F I G. 25
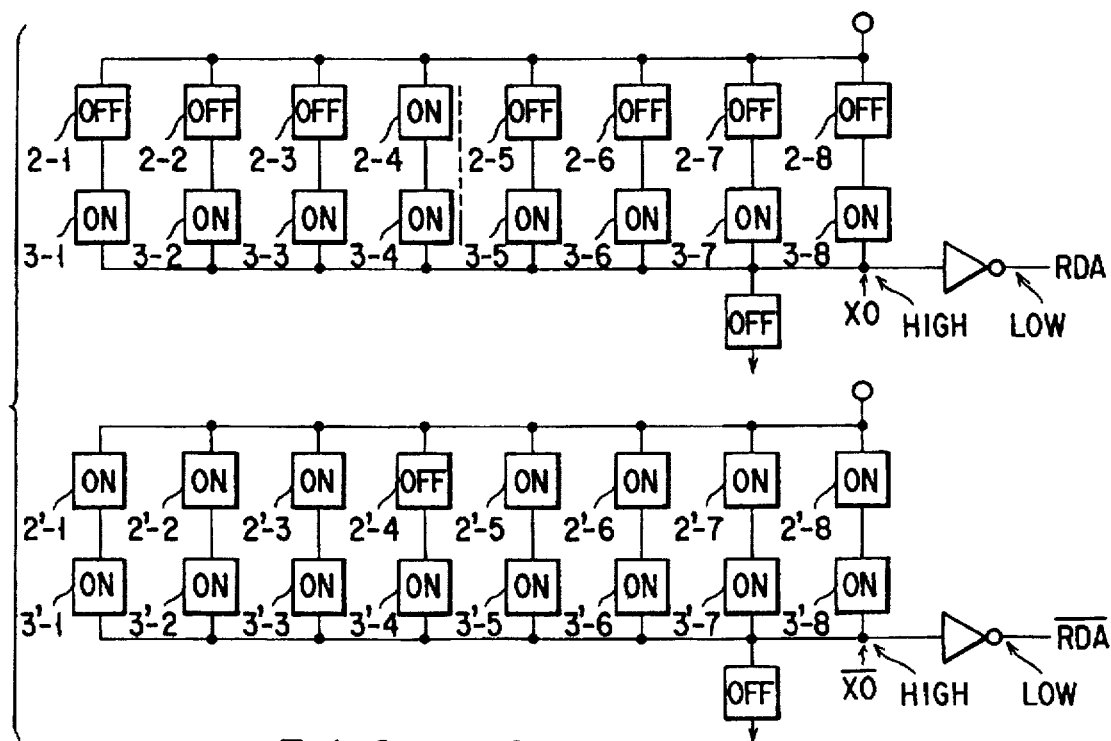
F I G. 26

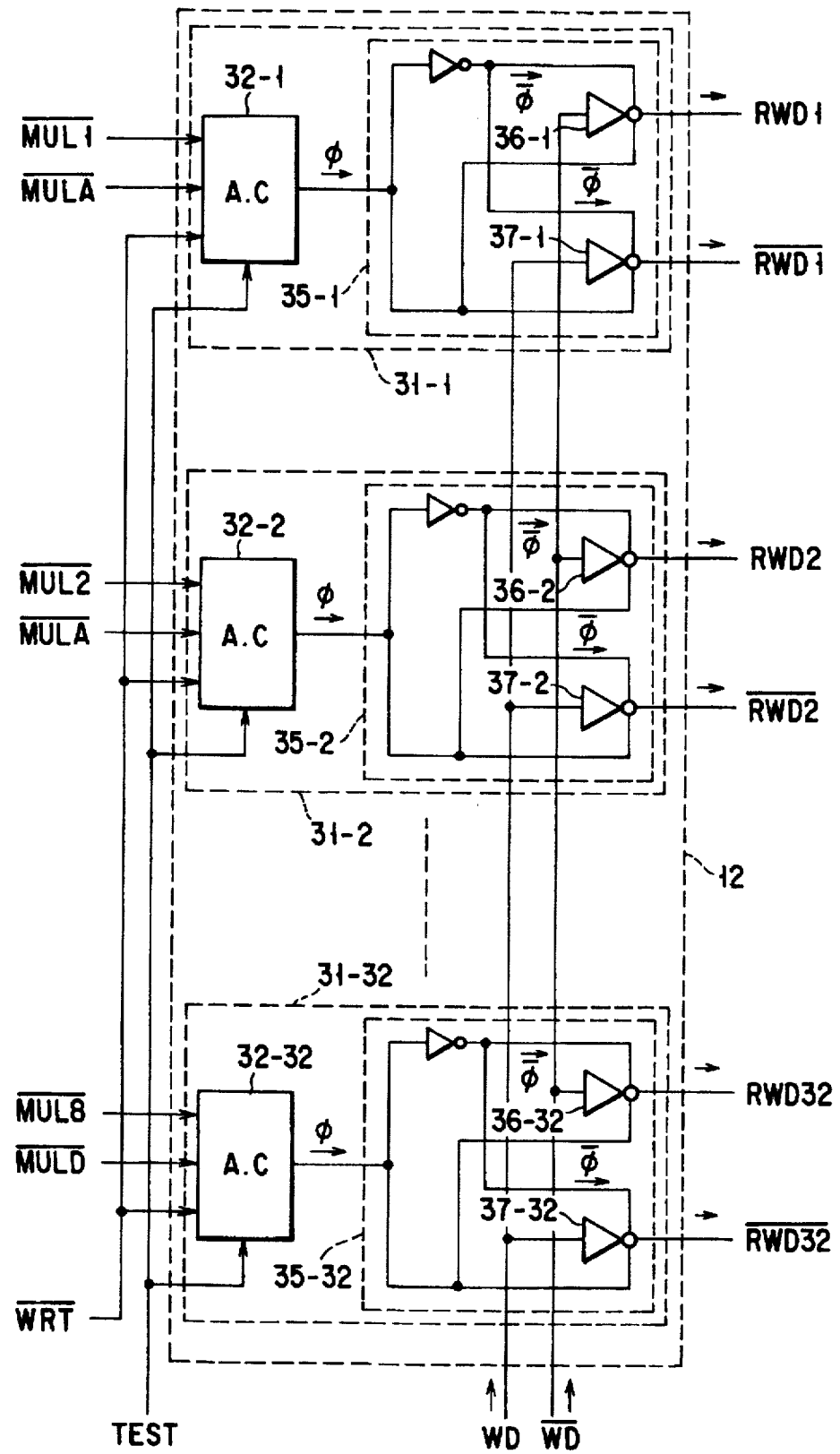
F I G. 27

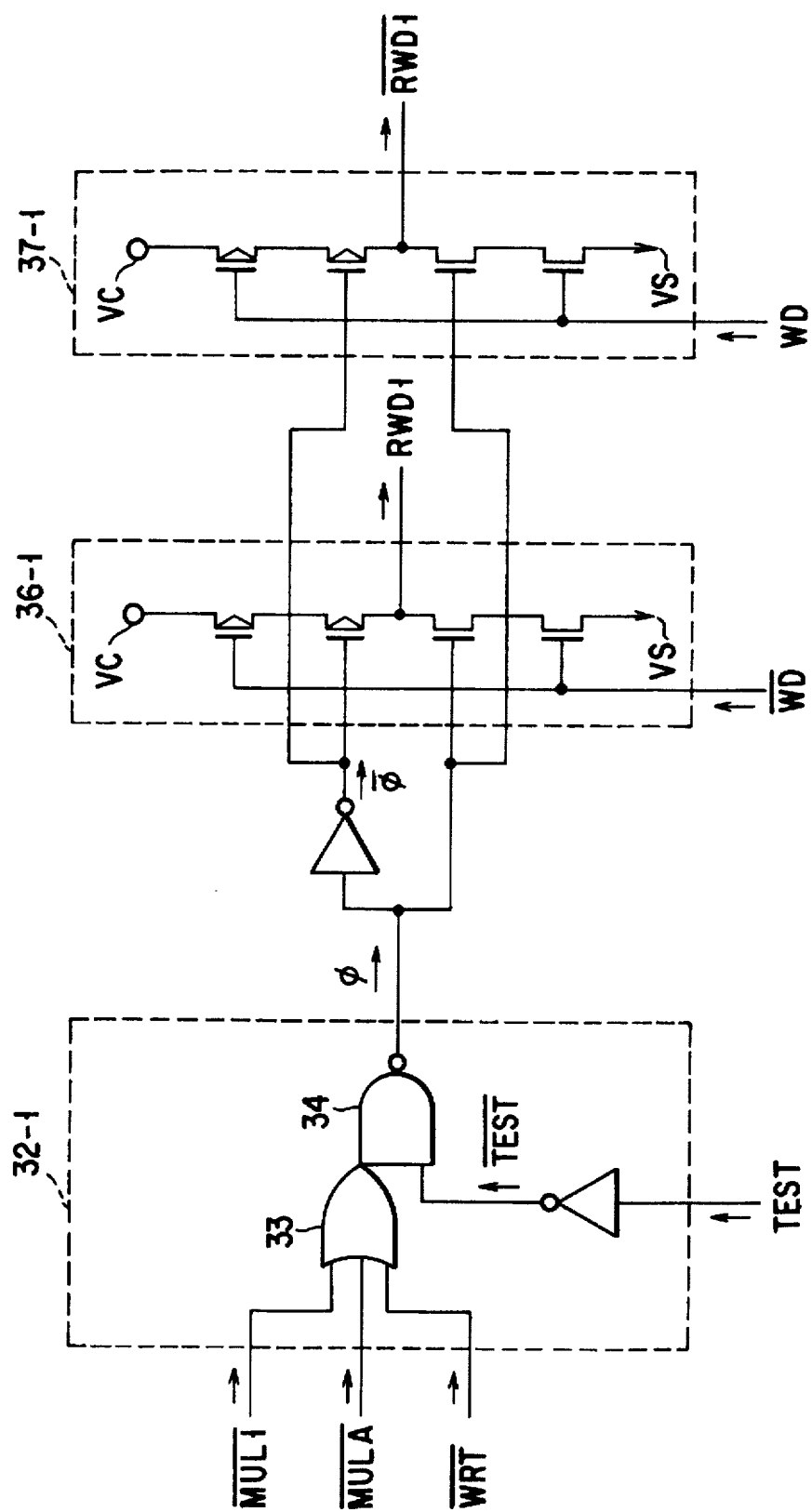
F I G. 28

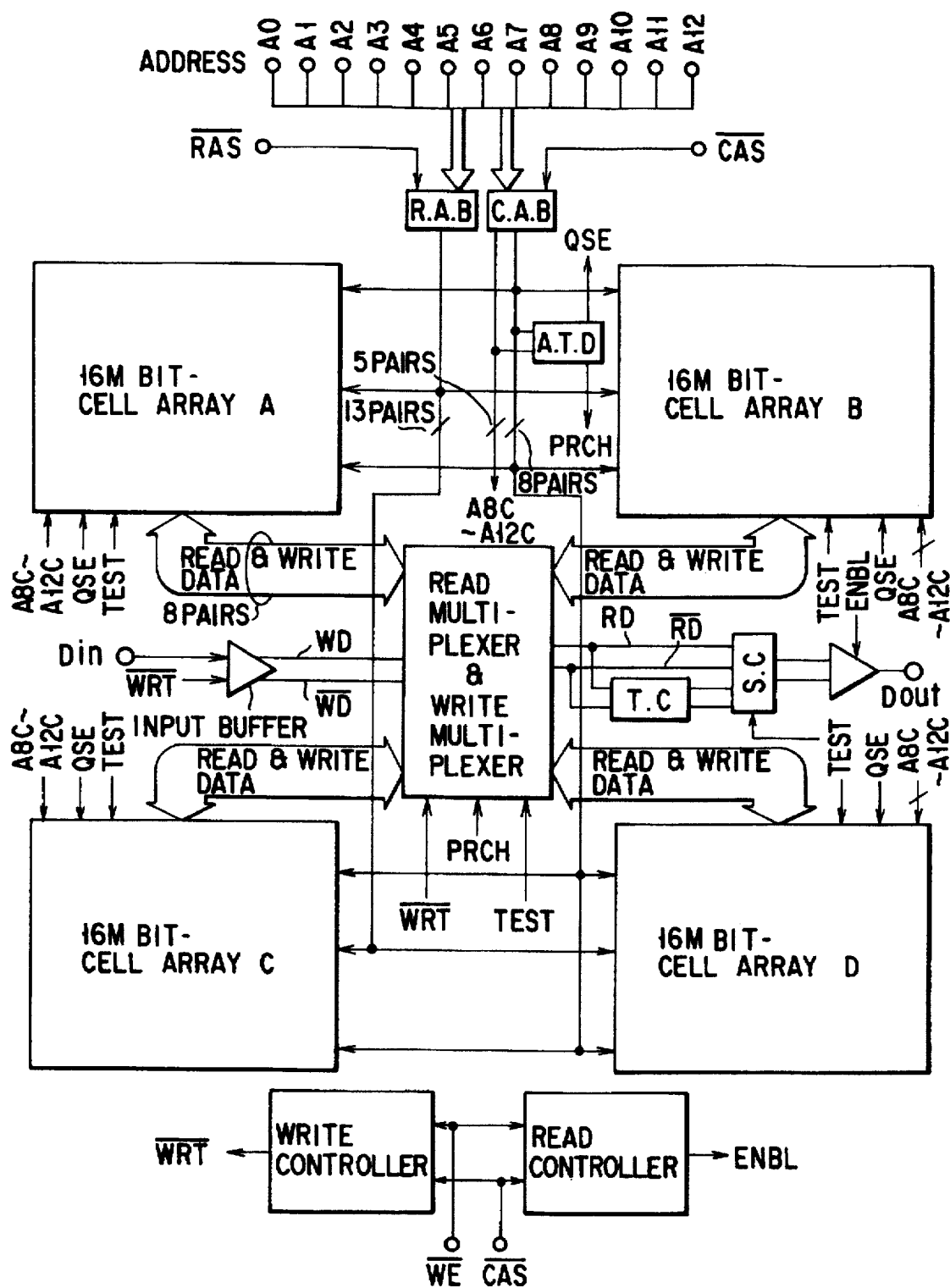
F I G. 29

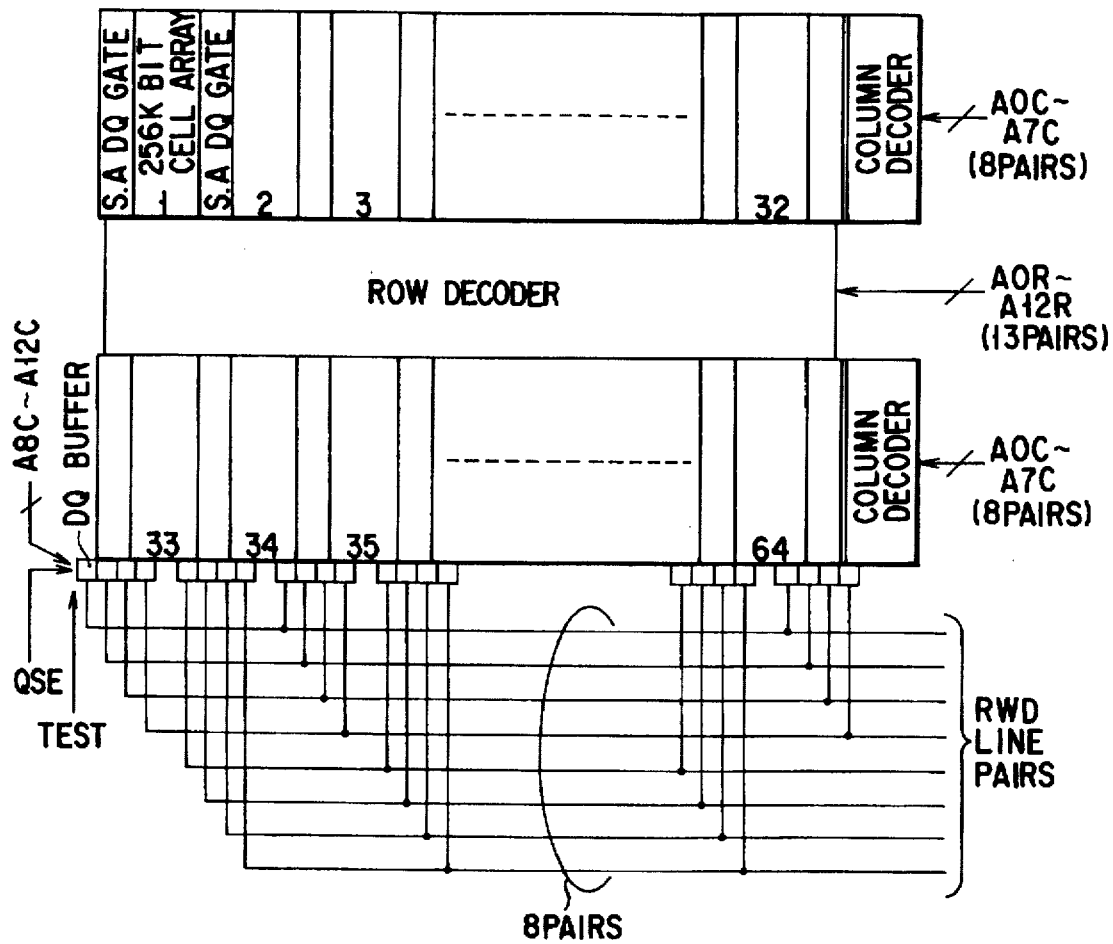
F I G. 30

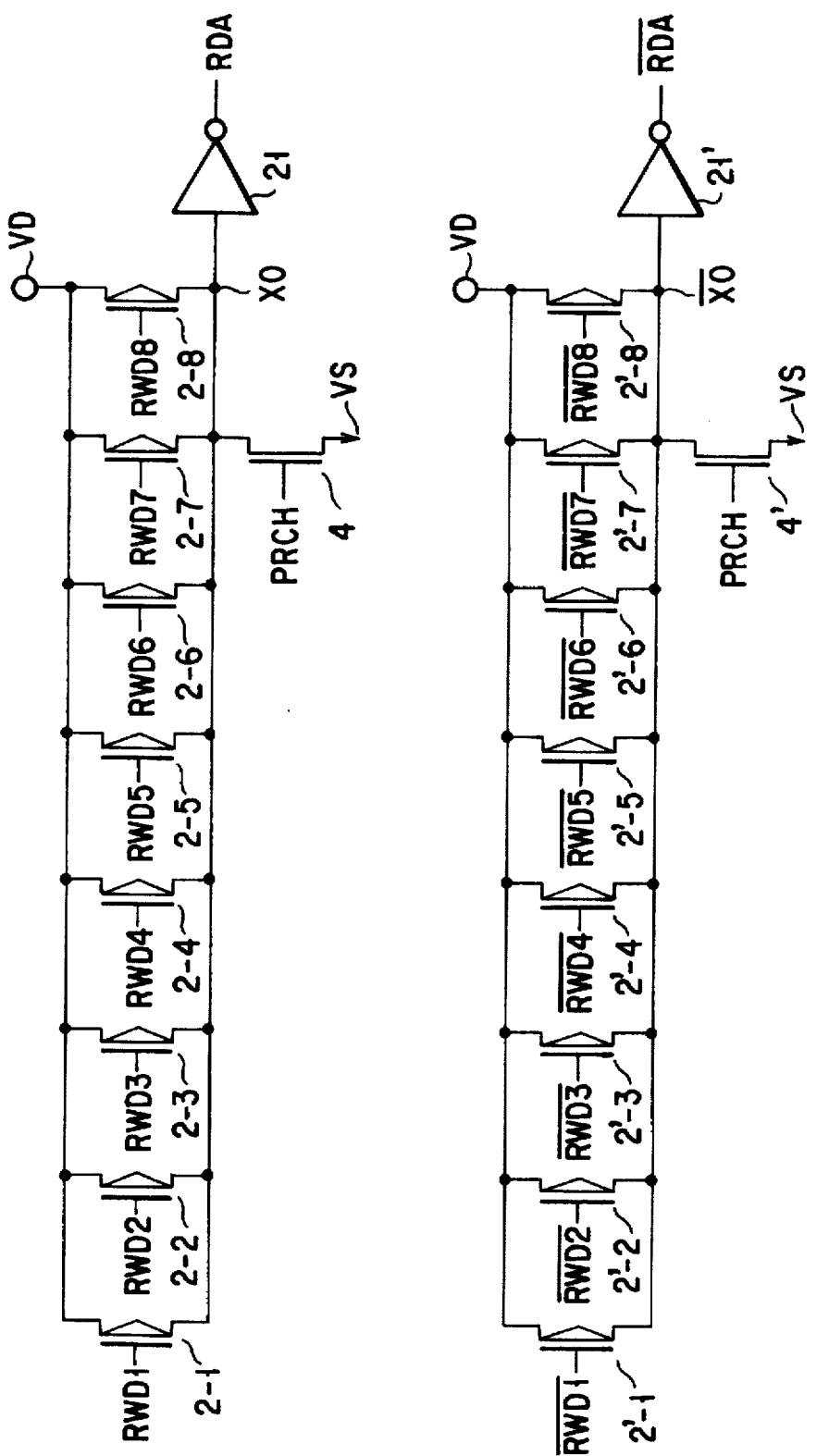
F I G. 31

HIGH SPEED, LOW NOISE CMOS MULTIPLEXER WITH PRECHARGE

This application is a continuation of application Ser. No. 08/393,076 filed Feb. 23, 1995, now abandoned.

BACKGROUND OF THE INVENTION

1. Field of the Invention

The present invention relates to a semiconductor integrated circuit device and, more particularly, to a semiconductor integrated circuit device in which a plurality of signal lines are integrated into a single signal line.

2. Description of the Related Art

Currently, multiplexers are used as semiconductor integrated circuit devices in which a plurality of signal lines are integrated into a single signal line. In the multiplexer, a signal line is selected from the plurality of signal lines, and the selected signal line is electrically connected to the single signal line.

As a multiplexer consisting of a CMOS transistor circuit, a transfer gate type multiplexer as shown in FIG. 1, or a clocked inverter type multiplexer as shown in FIG. 2 has been considered. In either type multiplexer, from selecting signals a, Ba, b, Bb, c, Bc, d, and Bd (the prefix "B" represents an inverted signal), data corresponding to a signal of high level is selected and transmitted to a common node X serving as an output terminal. Note that signals A to D are input data signals, and a signal Q is an output data signal.

In the multiplexer shown in FIG. 1 or 2, however, if the number of to-be-selected data is large, parasitic capacitances such as a junction capacitance and a gate capacitance added to the common node X increase. For this reason, a high-speed data selecting operation to select and output the input data may be impaired.

SUMMARY OF THE INVENTION

It is the first object of the present invention to provide a semiconductor integrated circuit device capable of operating at a high speed even when the number of to-be-selected data is large.

It is the second object of the present invention to provide a semiconductor integrated circuit device which achieves the first object and prevents an erroneous operation caused by noise.

It is the third object of the present invention to provide a semiconductor memory device which uses the above semiconductor integrated circuit device to operate at a high speed.

It is the fourth object of the present invention to provide a semiconductor memory device which uses the above semiconductor integrated circuit device to simplify a test circuit.

In order to achieve the first object, according to the present invention, there is provided a semiconductor integrated circuit device having a data selecting circuit connected to a first power supply terminal, a precharge circuit, connected to a second power supply terminal, for receiving a precharge signal, and a wiring line connected to a common connection point between the data selecting circuit and the precharge circuit. The data selecting circuit includes at least two, i.e., first and second data transmission circuits. A first input data signal and a first selecting signal are supplied to the first data transmission circuit. A second input data signal and a second selecting signal are supplied to the second data transmission circuit.

Parasitic capacitances, and particularly junction capacitances added to the common node of the semiconductor integrated circuit device with the above arrangement are present only at a connection point between the first data transmission circuit and the common node, a connection point between the second data transmission circuit and the common node, and a connection point between the precharge circuit and the common node. Therefore, the parasitic capacitances added to the common node are decreased to allow the high-speed operation of the semiconductor integrated circuit device.

In order to achieve the second object, according to the present invention, there is provided a semiconductor integrated circuit device in which a potential fixing circuit for fixing the potential of a common node at a predetermined potential is connected to the common node.

In the semiconductor integrated circuit device with the above arrangement, the potential of the common node is set at a floating level during a certain period from the OFF timing of the precharge circuit to the ON timing of the data transmission circuit. When the potential fixing circuit is connected to the common node, the potential of the common node can be fixed at a predetermined potential while the potential of the common node is at a floating level. Therefore, the semiconductor integrated circuit device can prevent an erroneous operation caused by noise.

In order to achieve the third object, the semiconductor integrated circuit device which achieves the first or second object is used as the data multiplex circuit of a semiconductor memory device.

In the semiconductor memory device with this arrangement, the parasitic capacitances of the data multiplex circuit are decreased. Therefore, the semiconductor memory device operates at a high speed.

In order to achieve the fourth object, in addition to a normal mode in which an input data signal is selected in accordance with a selecting signal, a test mode in which all input data signals are selected in accordance with a selecting signal is provided. The semiconductor integrated circuit device which achieves the first or second object can perform an OR operation by simultaneously transmitting all the input data signals to the common node. By using the OR operation function, correct/erroneous data is determined.

In the semiconductor memory device with the above arrangement, the multiplex circuit can be used as the OR operation circuit of the test circuit, thereby simplifying the test circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a block diagram of a semiconductor integrated circuit device according to the first embodiment of the present invention;

FIG. 4 is a circuit diagram of the semiconductor integrated device according to the first embodiment of the present invention;

FIG. 6 is a view showing the parasitic capacitances of the semiconductor integrated circuit device according to the first embodiment of the present invention;

FIG. 7 is a view showing the parasitic capacitances of the conventional multiplexer shown in FIG. 1;

FIG. 8 is a view showing the parasitic capacitances of the conventional multiplexer shown in FIG. 2;

FIG. 13 is a chart showing the operating waveforms of the DQ buffer shown in FIG. 12;

FIG. 15 is a circuit diagram of a multiplex signal generating circuit shown in FIG. 14;

FIG. 19 is a block diagram of the read multiplexer of a DRAM capable of changing the number of output bits;

FIG. 20 is a circuit diagram of a switch circuit shown in FIG. 19;

FIGS. 21 and 22 are charts showing the operating waveforms of the read multiplexer shown in FIG. 16;

FIGS. 25 and 26 are circuit diagrams schematically showing the multiplex circuit shown in FIG. 17;

FIG. 27 is a block diagram of the write multiplexer shown in FIG. 14;

FIG. 28 is a circuit diagram of a selecting circuit shown in FIG. 27;

FIG. 29 is a block diagram of a DRAM according to the third embodiment of the present invention;

FIG. 30 is a block diagram of a 16 Mbit-cell array shown in FIG. 29;

FIG. 31 is a circuit diagram of the multiplex circuit of a first multiplex stage provided to the DRAM according to the third embodiment of the present invention;

DETAILED DESCRIPTION OF THE PREFERRED EMBODIMENTS

Figure 1:
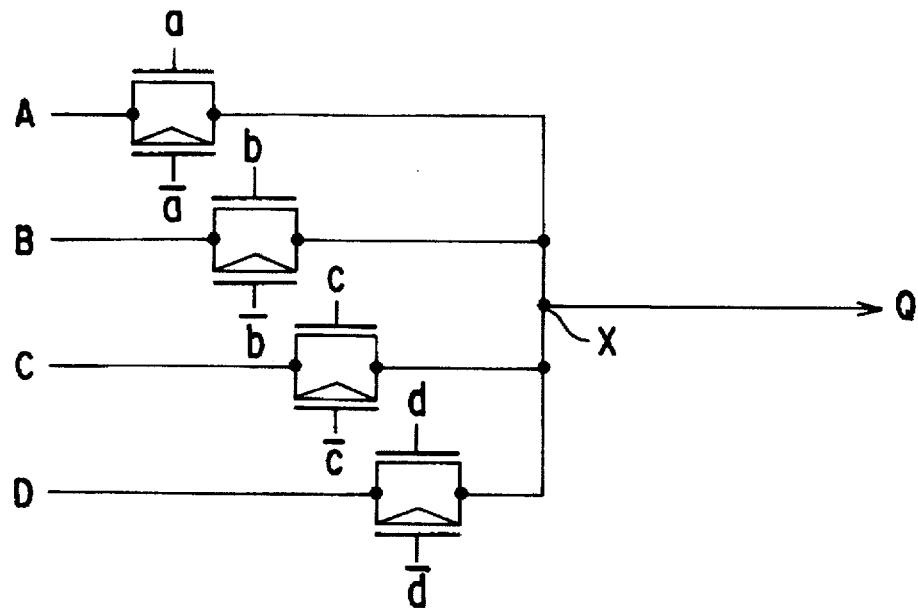
FIG. 1 is a circuit diagram of a conventional multiplexer.

The present invention will be described below in accordance with preferred embodiments. The same reference numerals and symbols denote the same elements throughout the drawings, and a detailed description thereof will be omitted.

FIG. 3 is a block diagram of a semiconductor integrated circuit device according to the first embodiment of the present invention. FIG. 4 is a circuit diagram of the semiconductor integrated circuit device according to the first embodiment.

As shown in FIG. 3, the integrated circuit device according to this embodiment includes a data selecting circuit 100 and a precharge circuit 200, both of which are connected in series between a high potential power supply terminal VDD and a ground terminal GND. A wiring line 1 is arranged between the circuits 100 and 200. The wiring line 1 is connected to a common node X between the circuits 100 and 200. The common node X serves as an output terminal of the integrated circuit device according to this embodiment. An output data signal BQ is output from the output terminal (common node X). Note that a prefix "B" of the output signal BQ represents that the level of an input data signal is inverted and output. Additionally, in this specification, the prefix "B" is defined to represent that the level of an input signal is inverted and output, as described above, or the signal itself is a negative logic. In the drawings, the prefix "B" is represented by "-" (bar).

As shown in FIG. 4, the data selecting circuit 100 includes a plurality of PMOS series circuits 102. The plurality of PMOS series circuits 102 are connected in parallel between the terminal VDD and the common node X. Each of the PMOS series circuits 102 includes a p-channel MOSFET (to be referred to as a PMOS hereinafter) 2 and a PMOS 3, which are connected in series with each other. The PMOS 2 connected to the terminal VDD is a transistor for receiving an input signal while the PMOS 3 connected to the common node X is a transistor for receiving a data selecting signal.

The integrated circuit device according to this embodiment has four sets of PMOS series circuits 102 (102-1 to 102-4). The PMOS series circuit 102-1 includes a PMOS 2-1 and a PMOS 3-1. The remaining PMOS series circuits 102-2 to 102-4 respectively include PMOSs 2-2 and 3-2, PMOSs 2-3 and 3-3, and PMOSs 2-4 and 3-4. Input data signals A to D are supplied to the gates of the PMOSs 2-1 to 2-4, respectively. The PMOSs 2-1 to 2-4 are turned on when the potentials of the data signals A to D go to low level. On the other hand, selecting signals Ba to Bd are supplied to the gates of the PMOSs 3-1 to 3-4, respectively. The PMOSs 3-1 to 3-4 are turned on when the potentials of the selecting signals Ba to Bd go to low level.

The precharge circuit 200 includes one n-channel MOS-FET (to be referred to as an NMOS hereinafter) 4 connected in series between the terminal GND and the common node X. The NMOS 4 is a transistor for receiving a precharge signal, and a precharge signal PRCH is supplied to the gate of the NMOS 4.

One of important functions of the NMOS 4 is to set the initial state of the potential level of the output signal BQ in response to the precharge signal. Another function is to control activation/inactivation of the integrated circuit device itself shown in FIGS. 1 or 2 in response to the precharge signal.

The NMOS 4 is turned on while the signal PRCH is at high level and charges the common node X to the ground potential. At this time, the initial state of the potential level of the output signal BQ is set at the ground potential. At the same time, the common node X is charged to the ground potential so that the integrated circuit device itself is set inactive. More specifically, even when the data signal and the data selecting signal are supplied to the data selecting circuit 100, the potential of the common node X is substantially equal to the ground potential.

On the other hand, the NMOS 4 is turned off while the signal PRCH is at low level. At this time, the integrated circuit device itself shown in FIG. 3 is activated, and the common node X is charged to a predetermined potential by a current output from the PMOS series circuits 102.

The basic operation of the integrated circuit device shown in FIGS. 3 and 4 will be described below.

Figure 5:
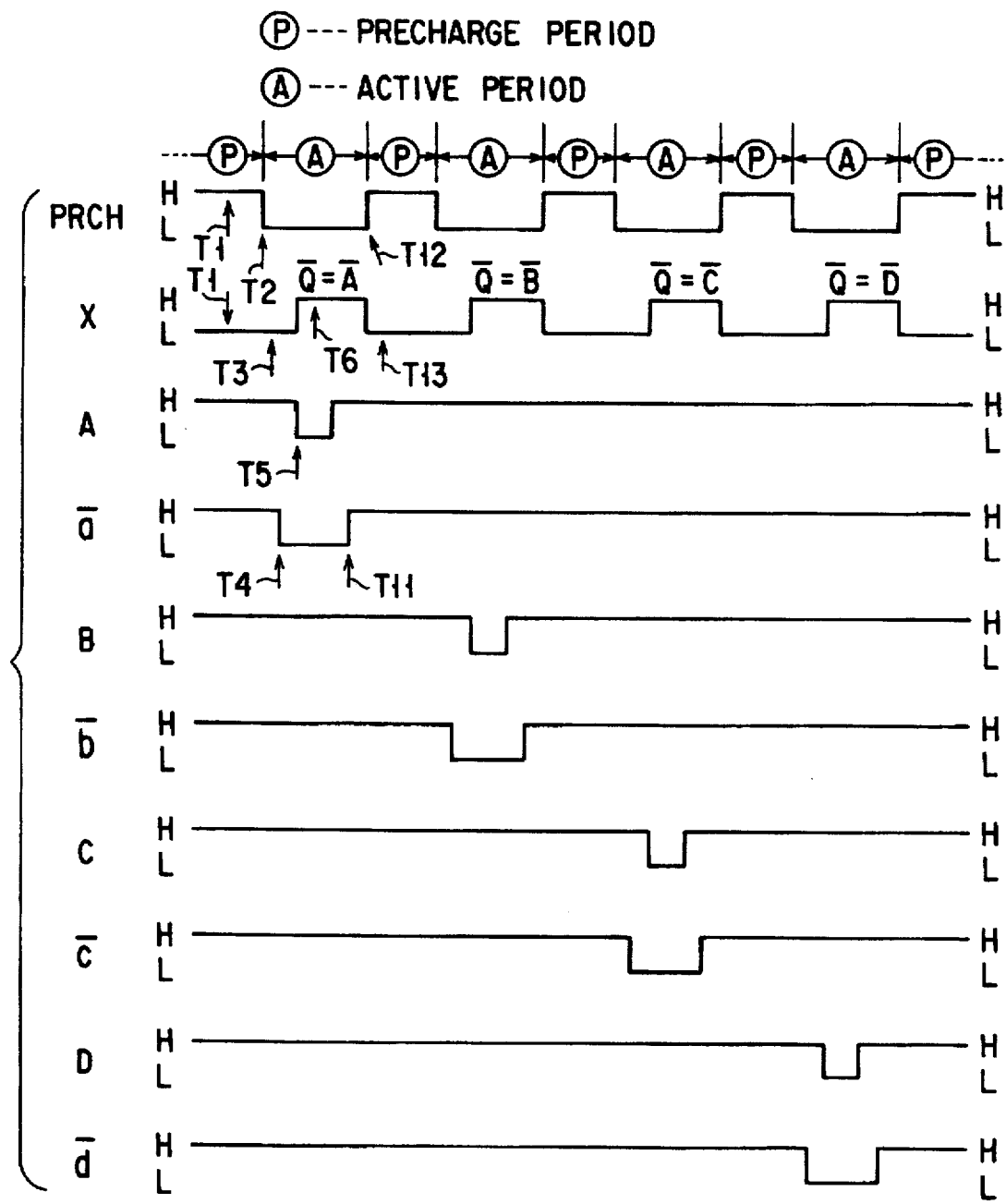
FIG. 5 is a chart showing the operating waveforms of the semiconductor integrated circuit device according to the first embodiment of the present invention.

FIG. 5 is a chart of the operating waveforms showing the operation of the integrated circuit device according to the first embodiment of the present invention.

In the integrated circuit device shown in FIGS. 3 and 4, the data signals A to D corresponding to the selecting signals Ba to Bd of low level are transmitted to the common node X. That is, the precharge signal PRCH is set at high level first, and the common node X is fixed at low level (ground potential) (T1). Thereafter, the precharge signal PRCH is set at low level (T2), and the common node X is set at a floating level (T3). One of the selecting signals Ba to Bd is set at low level. In this case, assume that the signal Ba is set at low level (T4). At this time, depending on whether the data signal A of high level goes to low level or not, it is determined whether the common node X is charged to high level or kept at low level (low floating level in this embodiment). In FIG. 5, the data signal A of high level goes to low level (T5). Therefore, the common node X is charged to high level (T6).

The precharge levels of the data signals A to D of the integrated circuit device shown in FIGS. 3 and 4 are high (high-level precharge type). In such an integrated circuit device of a high-level precharge type, the input data signal is transmitted to the common node X depending on whether the potential level of the input data signal goes to low or not.

If another data signal is to be output after one data signal is output, the selecting signal Ba is set at high level (T11). Thereafter, the precharge signal PRCH is set at high level (T12), and the common node X is charged to low level (ground potential) (T13). With this operation, the integrated circuit device is restored from the active period to the precharge period. When the above operation is performed for the remaining selecting signals Bb to Bd, the data signals B to D can be transmitted to the common node X.

As described above, the integrated circuit device according to the first embodiment of the present invention can act as a multiplexer. This is because only one data signal line is selected from the plurality of data signal lines, and the selected data signal line can be electrically connected to the wiring line 1.

FIG. 6 is a view showing parasitic capacitances added to the common node X of the integrated circuit device shown in FIGS. 3 and 4. Similarly, FIG. 7 is a view showing parasitic capacitances added to the common node X of the multiplexer shown in FIG. 1, and FIG. 8 is a view showing parasitic capacitances added to the common node X of the multiplexer shown in FIG. 2.

As shown in FIG. 6, the integrated circuit device shown in FIGS. 3 and 4 has only five parasitic capacitances, and particularly, p-n junction capacitances PN-J added to the common node X, i.e., four junction capacitances at the drains of the PMOSs 3-1 to 3-4 whose gates receive the selecting signals Ba to Bd, and one junction capacitance at the drain of the NMOS 4 whose gate receives the precharge signal PRCH.

To the contrary, as shown in FIG. 7, the multiplexer shown in FIG. 1 has eight p-n junction capacitances PN-J added to the common node X, i.e., four junction capacitances at the drains of the PMOSs of the CMOS transfer gate circuits, and four junction capacitances at the drains of the NMOSs.

Figure 2:
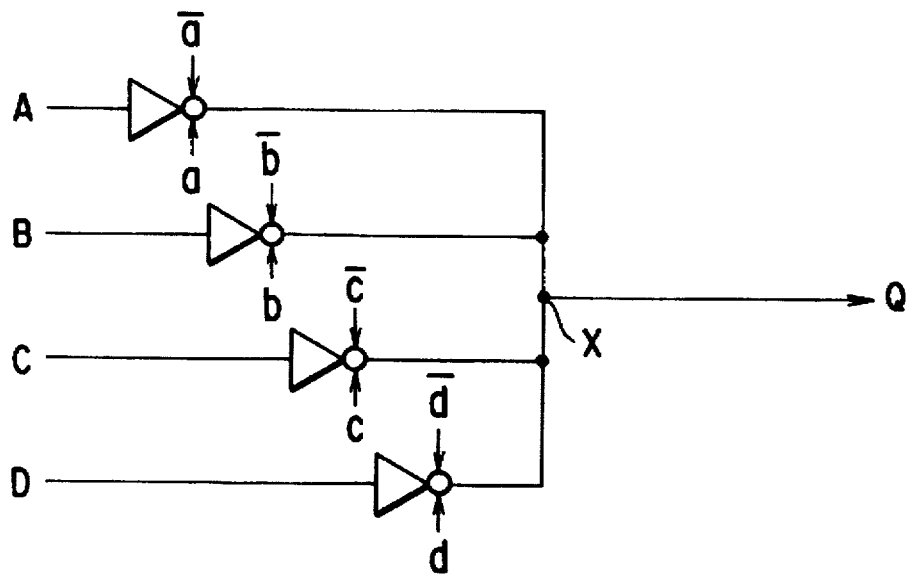
FIG. 2 is a circuit diagram of another conventional multiplexer.

As shown in FIG. 8, the multiplexer shown in FIG. 2 has eight p-n junction capacitances PN-J added to the common node X, i.e., four junction capacitances at the drains of the PMOSs of the CMOS clocked inverter circuits, and four junction capacitances at the drains of the NMOSs.

Therefore, the integrated circuit device shown in FIGS. 3 and 4 can act as a multiplexer and also operate at a high speed because the parasitic capacitances are largely decreased as compared to the multiplexers shown in FIGS. 1 and 2.

In addition, the data signals A to D of high level (in a precharge state) go to low level. For this reason, when these signals are set at a level lower than the power supply voltage VDD only by the absolute value of a threshold voltage Vth of the PMOS, the PMOSs 2 (2-1 to 2-4) are turned on to transmit the data signals to the common node X. Therefore, the data signals A to D can be quickly transmitted to the common node X.

Because of these advantages, the integrated circuit device shown in FIGS. 3 and 4 operates at a high speed as compared to the multiplexers shown in FIGS. 1 and 2.

The basic arrangement and operation have been described above.

The second embodiment of the present invention will be described below.

The second embodiment is a detailed application example of the present invention, in which an integrated circuit device according to the present invention is used as the data multiplex circuit of a dynamic RAM (DRAM).

Figure 9:
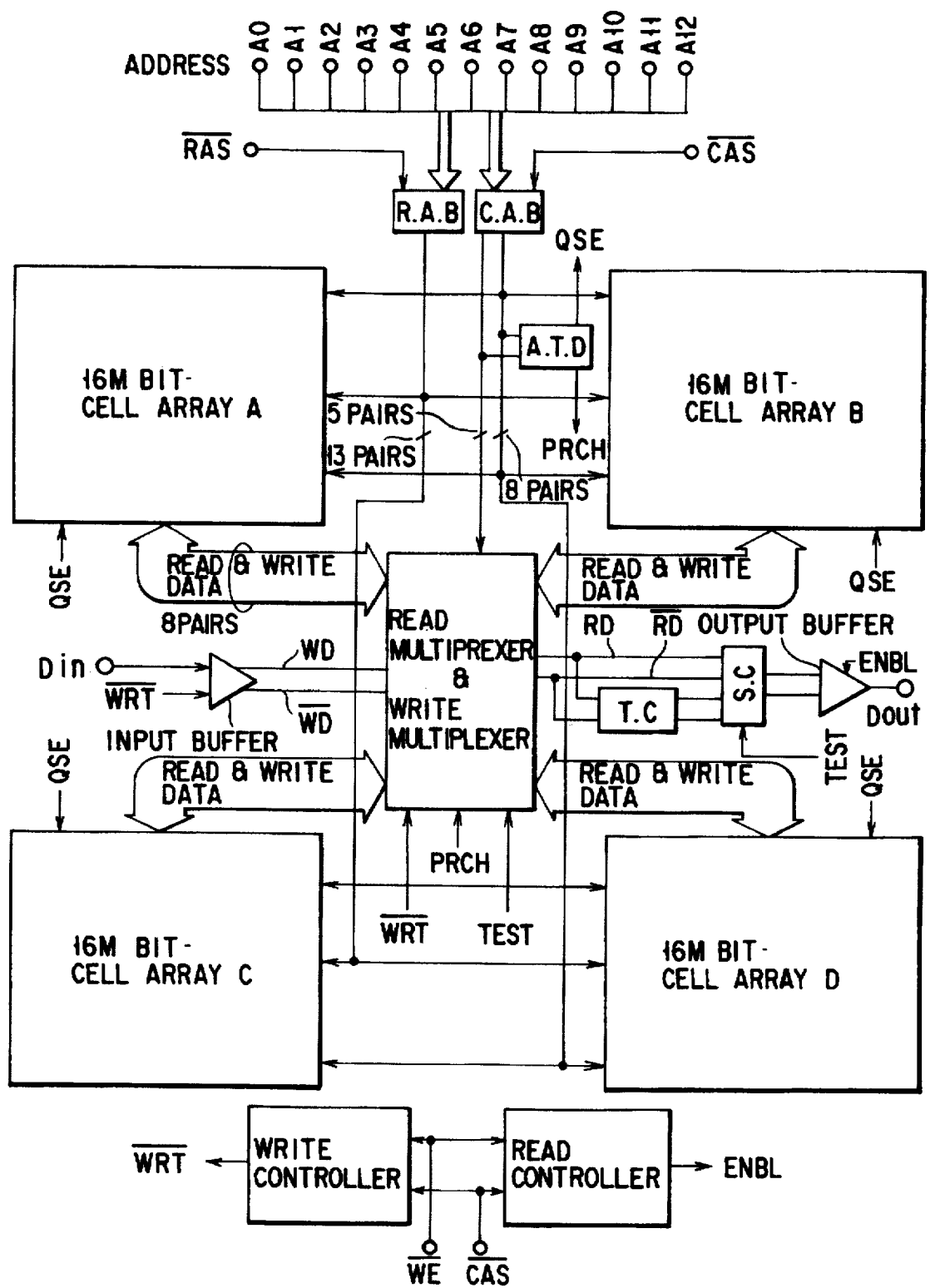
FIG. 9 is a block diagram of a DRAM according to the second embodiment of the present invention.
Figure 10:
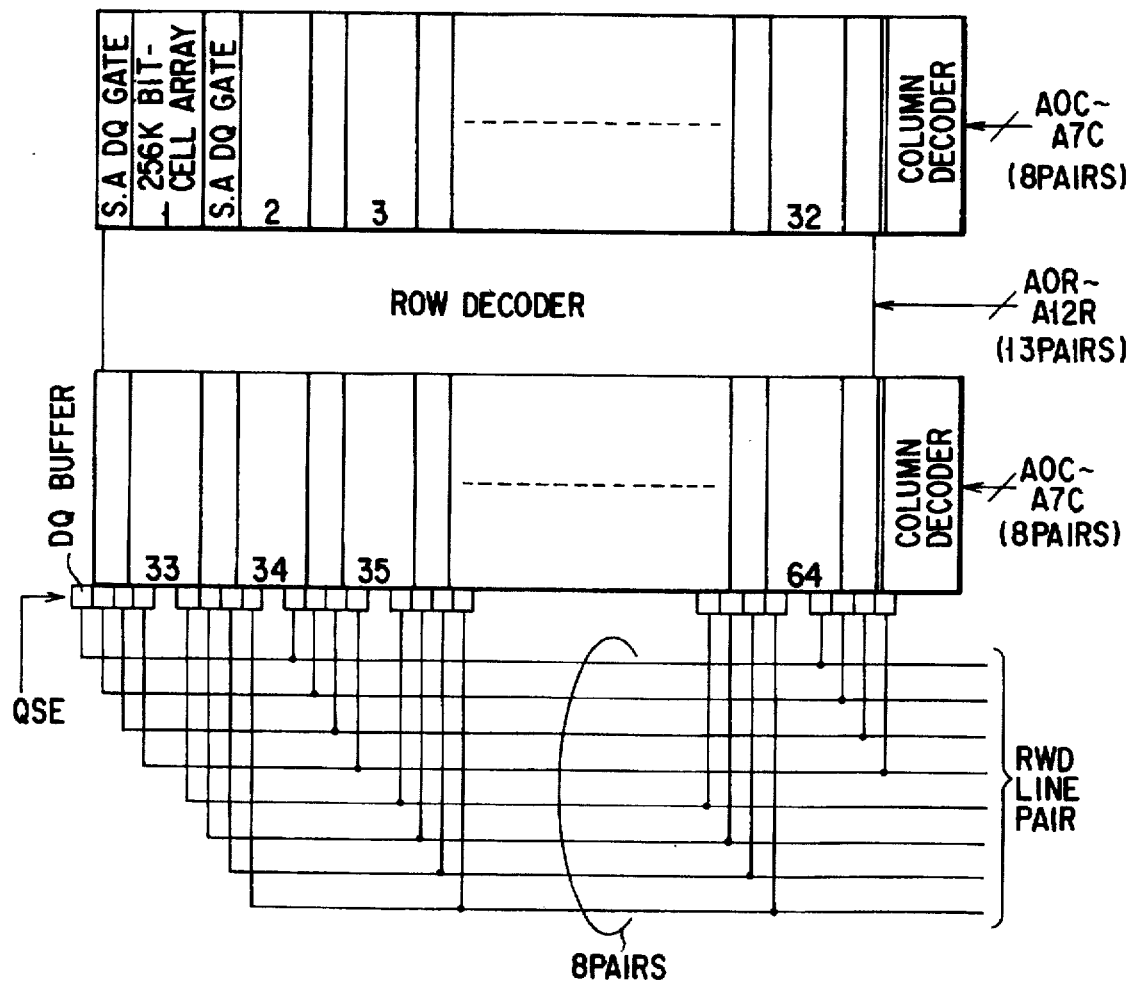
FIG. 10 is a block diagram of a 16 Mbit-cell array shown in FIG. 9.
Figure 11:
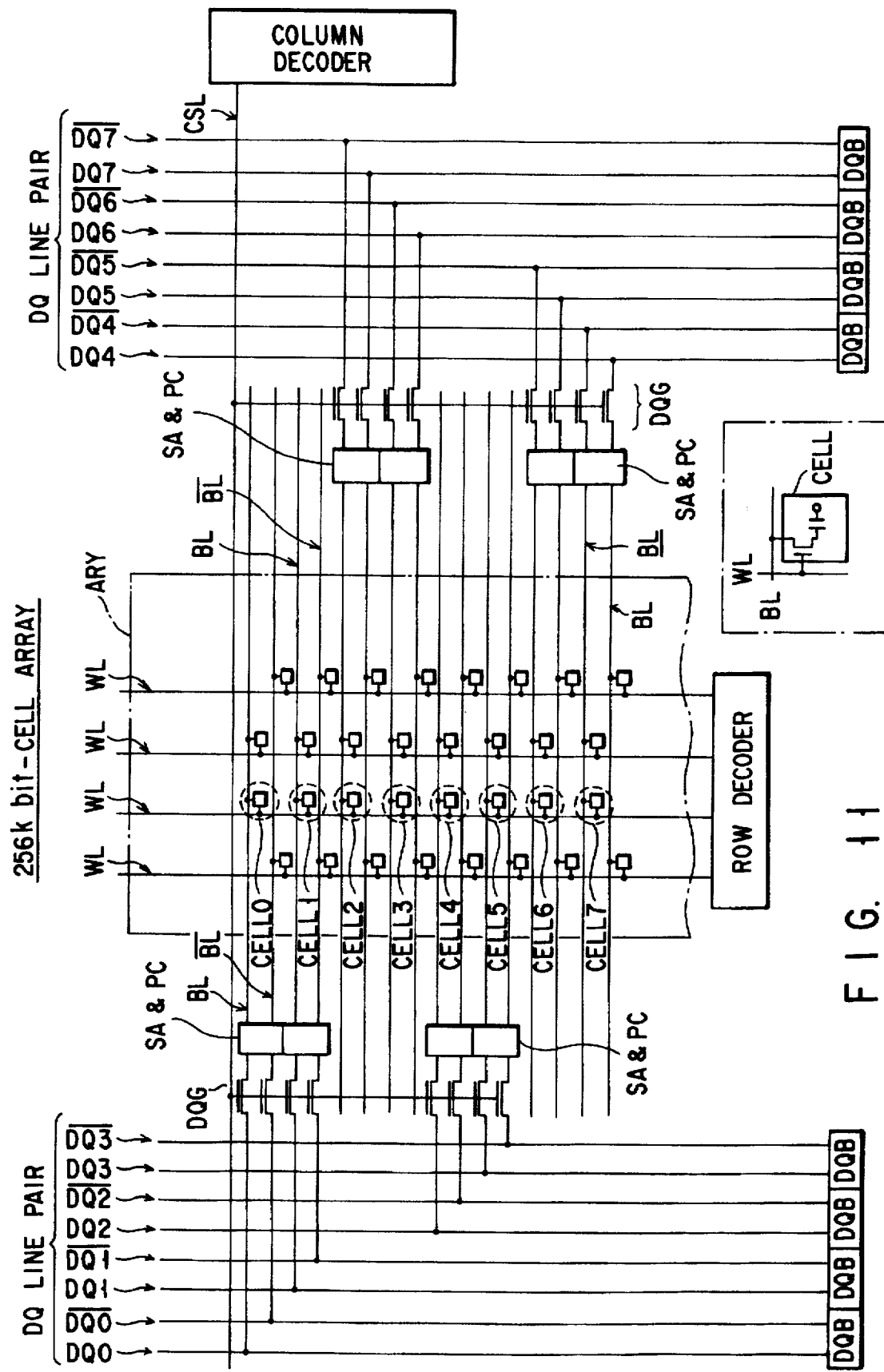
FIG. 11 is a block diagram of a 256 kbit-cell array shown in FIG. 10.
Figure 12:
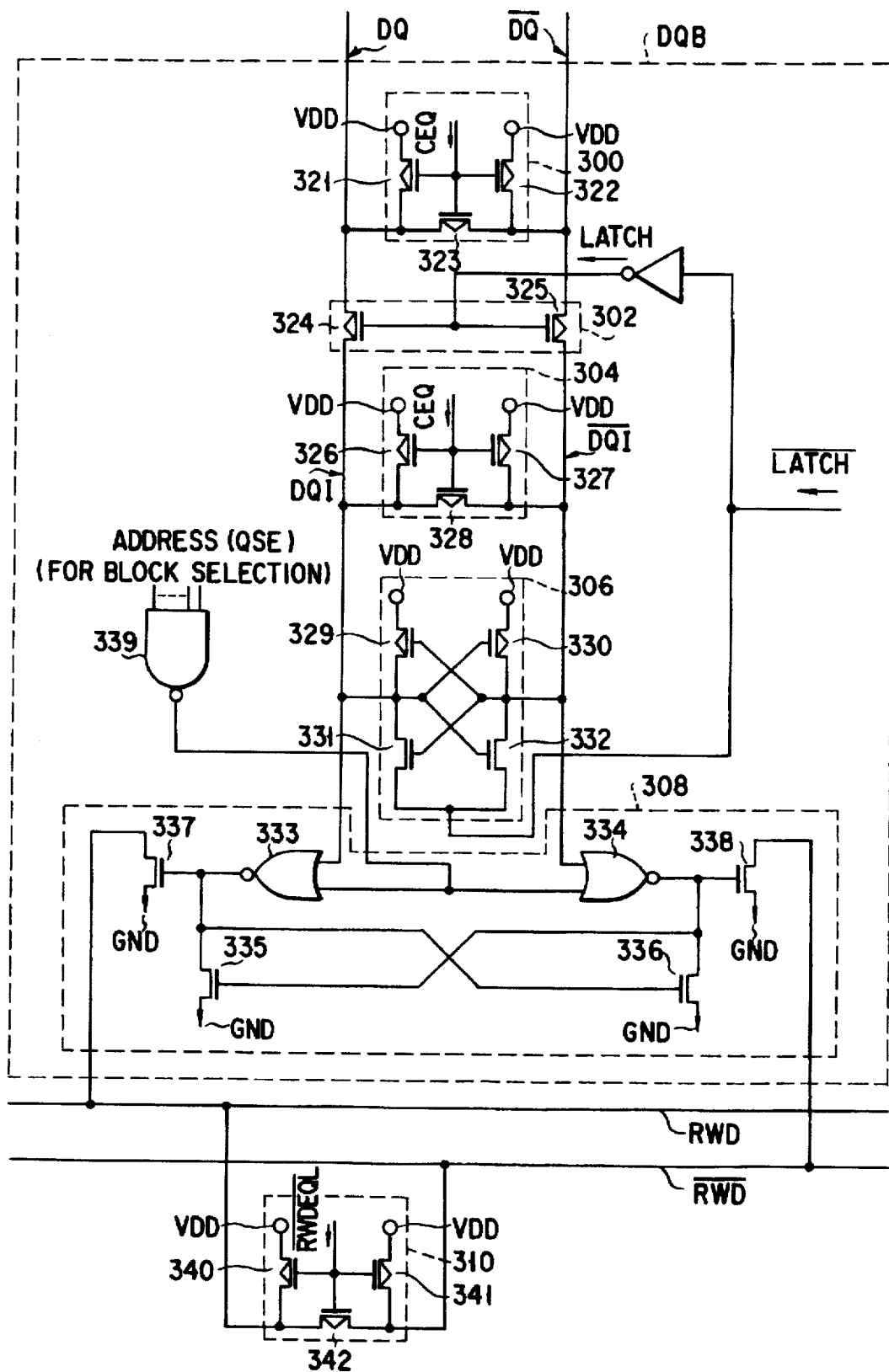
FIG. 12 is a circuit diagram of a DQ buffer shown in FIG. 10.

FIG. 9 is a block diagram schematically showing a DRAM according to the second embodiment of the present invention. FIG. 10 is a block diagram showing one of 16 Mbit-cell arrays shown in FIG. 9 in more detail. FIG. 11 is a block diagram showing one of 256 kbit-cell arrays shown in FIG. 10 in more detail. FIG. 12 is a circuit diagram showing one of DQ buffers shown in FIG. 10 in more detail.

The DRAM shown in FIG. 9 is a 64 Mbit DRAM.

As shown in FIG. 9, the 64 Mbit DRAM includes four 16 Mbit-cell arrays A to D.

As shown in FIG. 10, a row decoder is arranged at the center of each 16 Mbit-cell array. Thirteen pairs of row addresses A0R to A12R and BA0R to BA12R are supplied to the row decoder. A column decoder is arranged at one end of the 16 Mbit-cell array. Eight pairs of column addresses A0C to A7C and BA0C to BA7C are supplied to the column decoder. The 16 Mbit-cell array also includes 64 256 kbit-cell arrays.

As shown in FIG. 11, bit line pair precharge circuits (PC), sense amplifiers (SA), and DQ gates (DQG) are arranged on both the sides of a 256 kbit-cell array (ARY). Each bit line pair precharge circuit (PC) equalizes the potential difference between the bit line pairs (the bit line pair includes a bit line BL and an inverted bit line BBL) and precharges the bit line pairs. After the bit line pairs are precharged, a data signal is read out from a memory cell (CELL). At this time, a small potential difference is generated between the bit line pairs. The sense amplifier (SA) amplifies this small potential difference. The DQ gate (DQG) transmits the data signal amplified by the sense amplifier (SA) to a data line pair (the DQ line pair includes a DQ line DQ and an inverted DQ line BDQ) on the basis of a signal CSL. The signal CSL is a signal for selecting a column of the memory cell array, which is output from the column decoder. In the DRAM according to this embodiment, four data line pairs are arranged on each side of the 256 kbit-cell array (ARY).

In the DRAM according to this embodiment, the data signal amplified by the sense amplifier (SA) is supplied to four DQ buffers (DQB) shown in FIG. 11. The data signal received by the DQ buffers (DQB) is further amplified by the DQ buffers (DQB). The data signal amplified by the DQ buffers (DQB) is supplied to a read/write data line pair (the read/write data line pair includes a read/write data line RWD and an inverted read/write data line BRWD).

As shown in FIG. 12, the DQ buffer (DQB) includes a DQ line equalizer 300 for equalizing a potential difference between the pair of DQ lines (DQ, BDQ), a transfer gate 302 for transferring a data signal from the pair of DQ lines to a pair of internal DQ lines (DQI, BDQI), an internal DQ line equalizer 304 for equalizing a potential difference between the pair of internal DQ lines, a sense amplifier 306 for amplifying a potential difference between the pair of internal DQ lines, and an RWD line pair driving circuit 308 for driving a pair of read/write data lines (RWD, BRWD) based on data in the internal DQ line pair.

An RWD line equalizer 310 for equalizing a potential difference between the pair of read/write data lines is connected between the read/write data line RWD and the inverted read/write data line BRWD.

The DQ line equalizer 300 includes a PMOS 321 connected in series between the high potential power source terminal VDD and the line DQ, a PMOS 322 connected in series between the power source terminal VDD and the line BDQ, and a PMOS 323 connected in series between the lines DQ and BDQ. The gates of the PMOSs 321, 322 and 323 are connected to a line through which a DQ line equalizing signal CEQ is supplied.

The transfer gate 302 includes a PMOS 324 connected in series between the lines DQ and DQI and a PMOS 325 connected in series between the lines BDQ and BDQI. The gates of the PMOSs 324 and 325 are connected to a line through which a signal LATCH, which is an inversion of an inverted latch signal BLATCH, is supplied.

The internal DQ line equalizer 304 includes a PMOS 326 connected in series between the power source terminal VDD and the line DQI, a PMOS 327 connected in series between the power source terminal VDD and the line BDQI, and a PMOS 328 connected in series between the lines DQI and BDQI. The gates of the PMOSs 326, 327 and 328 are connected to a line through which the DQ line equalizing signal CEQ is supplied.

The sense amplifier 306 includes a PMOS 329 connected in series between the power source terminal VDD and the line DQI, a PMOS 330 connected in series between the power source terminal VDD and the line BDQI, an NMOS 331 connected in series between the line DQI and the line through which the inverted latch signal BLATCH is supplied, and an NMOS 332 connected in series between the line BDQI and the line through which the inverted latch signal BLATCH is supplied. The gate of the PMOS 329 is connected to the line BDQI. The gate of the PMOS 330 is connected to the line DQI. The gate of the NMOS 331 is connected to the line BDQI. The gate of the NMOS 332 is connected to the line DQI.

The RWD line pair driving circuit 308 includes a two-input NOR gate 333 having an input terminal connected to the line DQI, a two-input NOR gate 334 having an input terminal connected to the line BDQI, an NMOS 335 connected in series between the output terminal of the NOR gate 333 and the low potential power source terminal GND, an NMOS 336 connected in series between the output terminal of the NOR gate 334 and the power source terminal GND, an NMOS 337 connected in series between the line RWD and the power source terminal GND, and an NMOS 338 connected in series between the line BRWD and the power source terminal GND. The other input terminals of the NOR gates 333 and 334 are connected to the output terminal of a NAND gate 339. Address signals ADDRESS for block selection are input to a plurality of input terminals of the NAND gate 339. The gates of the NMOSs 335 and 338 are connected to the output terminal of the NOR gate 334. The gates of the NMOSs 336 and 337 are connected to the output terminal of the NOR gate 333.

The RWD line equalizer includes a PMOS 340 connected in series between the power source terminal VDD and the line RWD, a PMOS 341 connected in series between the power source terminal VDD and the line BRWD, and a PMOS 342 connected in series between the lines RWD and BRWD. The gates of the PMOSs 340, 341 and 342 are connected to a line through which an RWD line inverted equalizing signal BRWDEQL is supplied.

FIG. 13 is a waveform diagram showing an operation of the DQ buffer shown in FIG. 12.

As shown in FIG. 13, when the DQ line equalizing signal CEQ and the RWD line inverted equalizing signal BRWDEQL are high in level, the DQ line equalizer 300, the internal DQ line equalizer 304 and the RWD line equalizer 310 are in an off state. When the inverted latch signal BLATCH is low in level, the transfer gate 302 is in the off state.

When the DQ line equalizing signal CEQ and the RWD line inverted equalizing signal BRWDEQL are turned to low in level and the inverted latch signal BLATCH is turned to high in level, the DQ line equalizer 300, the internal DQ line equalizer 304, the RWD line equalizer 310 and the transfer gate 302 are turned on. When these circuits are turned on, the potential differences between the pair of DQ lines and between the pair of RWD lines are equalized to the high level (high level precharge). Thereafter, when the DQ line equalizing signal CEQ and the RWD line inverted equalizing signal BRWDELQ are turned high in level, the DQ line equalizer 300, the internal DQ line equalizer 304 and the RWD line equalizer 310 are turned off again. The data signal is transferred from the pair of DQ lines to the pair of internal DQ lines through the transfer gate 302. The data signal transferred to the pair of internal DQ lines is input to the NOR gates 333 and 334 of the RWD line pair driving circuit 308. When the NOR gates 333 and 334 are activated by an output signal from the NAND gate 339, either the NMOS 337 or 338 is turned on in accordance with the level of the data signal transferred to the internal DQ line pair. For example, when the NMOS 338 is turned on, the BRWD line is discharged through the NMOS 338 to the power source terminal GND, with the result that the potential of the line BRWD is changed from the high level to the low level. At this time, the potential of the line RWD is kept high in level. In this manner, the data signal is transferred from the pair of DQ lines to the pair of RWD lines.

When the NMOS 337 is turned on, the RWD line is discharged, with the result that the potential of the line RWD is changed from the high level to the low level. At this time, the potential of the line BRWD is kept high in level.

In the DRAM according to this embodiment, the two 265K bit cell arrays (ARY) arranged on both the sides of the row decoder are simultaneously activated, and data is selectively transmitted to the eight DQ line pairs (four pairs are arranged on each side) in accordance with the column selecting signal CSL shown in FIG. 11. Thereafter, the data signal is amplified by the eight DQ buffers (DQB) and transmitted to the eight RWD line pairs. This read operation is simultaneously parallelly performed in all the four 16 Mbit-cell arrays. In the entire chip, 8×4=32-bit data is eventually transmitted to the read multiplexer & write multiplexer (multiplex circuit) at the center of the chip via the RWD line pairs. In the multiplexer, the data of one read/write data line pair RWD is selected in accordance with five pairs of addresses (A8C to A12C and BA8C to BA12C) and output to a read data line pair RD. This data is supplied to an output buffer via the selecting circuit and output to an output pad Dout. With the DQ buffer shown in FIG. 12, the precharge level of the read/write data line pair can be set to "H" level, and the integrated circuit device shown in FIG. 3 can be used as the multiplex circuit of the DRAM.

On the other hand, in a normal write mode, an operation opposite to the above operation is performed in which data supplied from the outside of the chip is supplied to an input buffer from an input pad Din and output to write data line pairs WD and BWD. In the read multiplexer & write multiplexer, one read/write data line pair RWD is selected in accordance with the five pairs of addresses (A8C to A12C and BA8C to BA12C). The data is supplied to the bit line pair through a write DQ buffer (not shown), the DQ line pair, and the DQ gate. With this operation, the data is written in the memory cell.

Note that a test read operation will be described later.

The read multiplexer & write multiplexer to which the DRAM of the present invention is applied will be described below.

Figure 14:
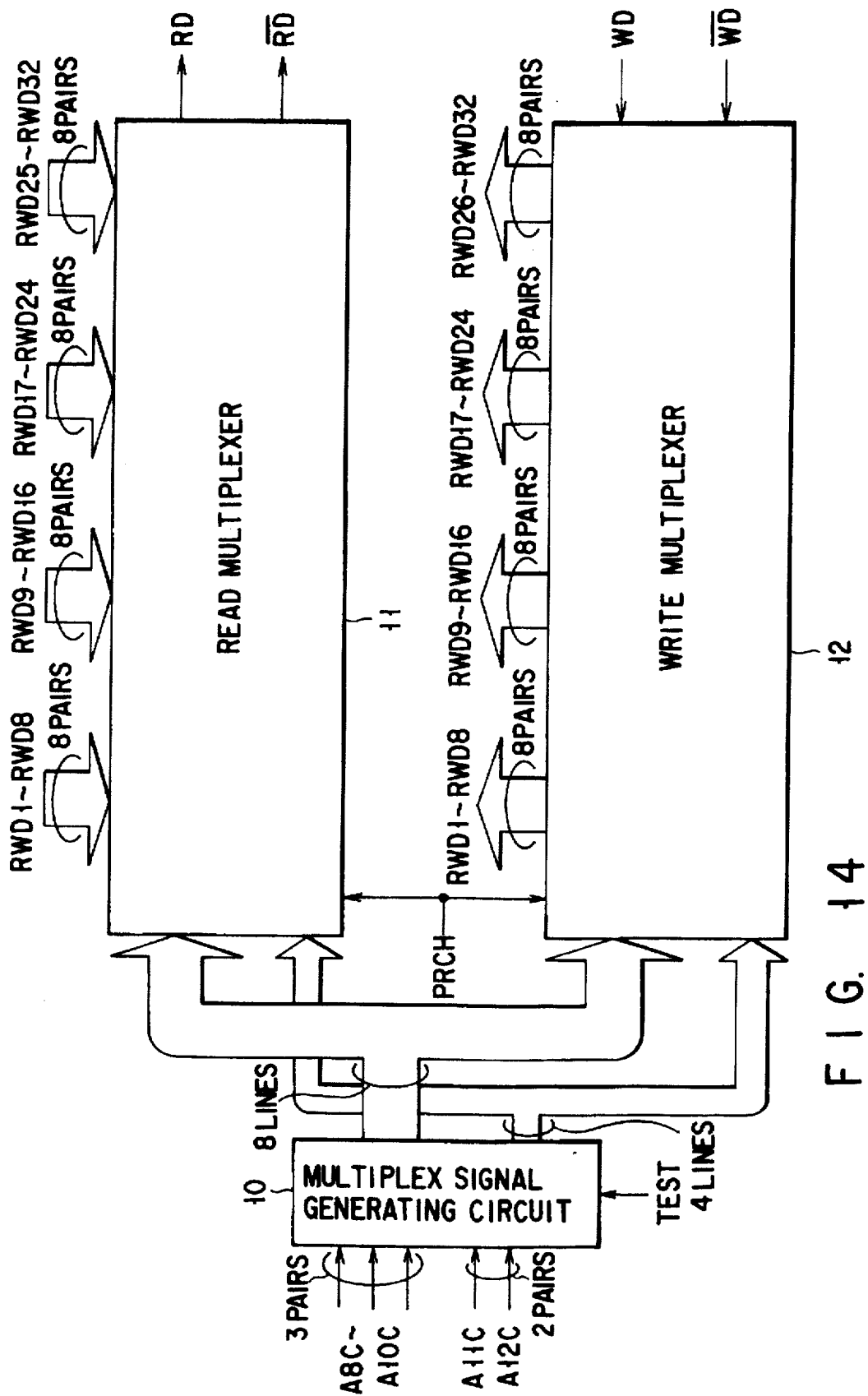
FIG. 14 is a block diagram of a read multiplexer & write multiplexer shown in FIG. 9.

FIG. 14 is a block diagram schematically showing the read multiplexer & write multiplexer shown in FIG. 9.

As shown in FIG. 14, the read multiplexer & write multiplexer includes a multiplex signal generating circuit 10, a read multiplexer 11, and a write multiplexer 12.

The generating circuit 10 generates eight multiplex signals BMUL1 to BMUL8 and four multiplex signals BMULA to BMULD, i.e., 12 multiplex signals from the five pairs of column addresses (A8C to A12C and BA8C to BA12C).

The read multiplexer 11 is used in a normal read operation and a test read operation. In the normal read operation, one of 32 read/write data line pairs (RWD1 to RWD32 and BRWD1 to BRWD 32) is selected using the 12 multiplex signals BMUL1 to BMUL8 and BMULA to BMULD, and the selected pair is electrically connected to the read data line pair (RD and BRD).

In the test read operation, all the 32 read/write data line pairs (RWD1 to RWD32 and BRWD1 to BRWD32) are selected, and all the 32 pairs are electrically connected to the read data line pair (RD and BRD). At the same time, signals in all the read/write data line pairs are ORed.

On the other hand, the write multiplexer 12 is used in a normal write operation and a test write operation. In the normal write operation, one of 32 read/write data line pairs (RWD1 to RWD32 and BRWD1 to BRWD32) is selected using the 12 multiplex signals (BMUL1 to BMUL8 and BMULA to BMULD), and the write data line pair (WD and BWD) is electrically connected to the selected read/write data line pair.

In the test write operation, all the 32 read/write data line pairs (RWD1 to RWD32 and BRWD1 to BRWD32) are selected, and the write data line pair (WD and BWD) is electrically connected to all the 32 pairs.

The operation will be described below with reference to the arrangement of each element.

FIG. 15 is a circuit diagram of the multiplex signal generating circuit.

As shown in FIG. 15, the multiplex signal generating circuit 10 includes 12 multiplex signal generating gate circuits 14-1 to 14-12. Of the 12 gate circuits, the eight gate circuits 14-1 to 14-8 respectively generate the eight multiplex signals BMUL1 to BMUL8 from the three pairs of column addresses A8C to A10C and BA8C to BA10C. The four remaining gate circuits 14-9 to 14-12 respectively generate the four multiplex signals BMULA to BMULD from the two pairs of column addresses A11C, A12C, BA11C, and BA12C.

The 12 gate circuits 14-1 to 14-12 have almost the same arrangement, and only that of the gate circuit 14-1 for generating the multiplex signal BMUL1 will be exemplified and described.

The gate circuit 14-1 includes an AND gate 15 for receiving the three column addresses BA8C, BA9C, and BA10C, and a NOR gate 16 for receiving an output from the AND gate 15 via one input terminal and outputting the multiplex signal BMUL1.

A test mode signal TEST is supplied to the other input terminal of the NOR gate 16. The signal TEST goes to low level in a normal mode and goes to high level in a test mode. For this reason, in the normal mode, an output from the AND gate 15 is inverted and output from the NOR gate 16. The output level of the multiplex signal BMUL1 is determined by the output level of the AND gate 15.

On the other hand, in the test mode, the NOR gate 16 always outputs the multiplex signal BMUL1 of low level independently of the output level of the AND gate 15.

The 12 multiplex signals BMUL1 to BMUL8 and BMULA to BMULD generated in this manner are supplied to the read multiplexer 11 and the write multiplexer 12.

Figure 16:
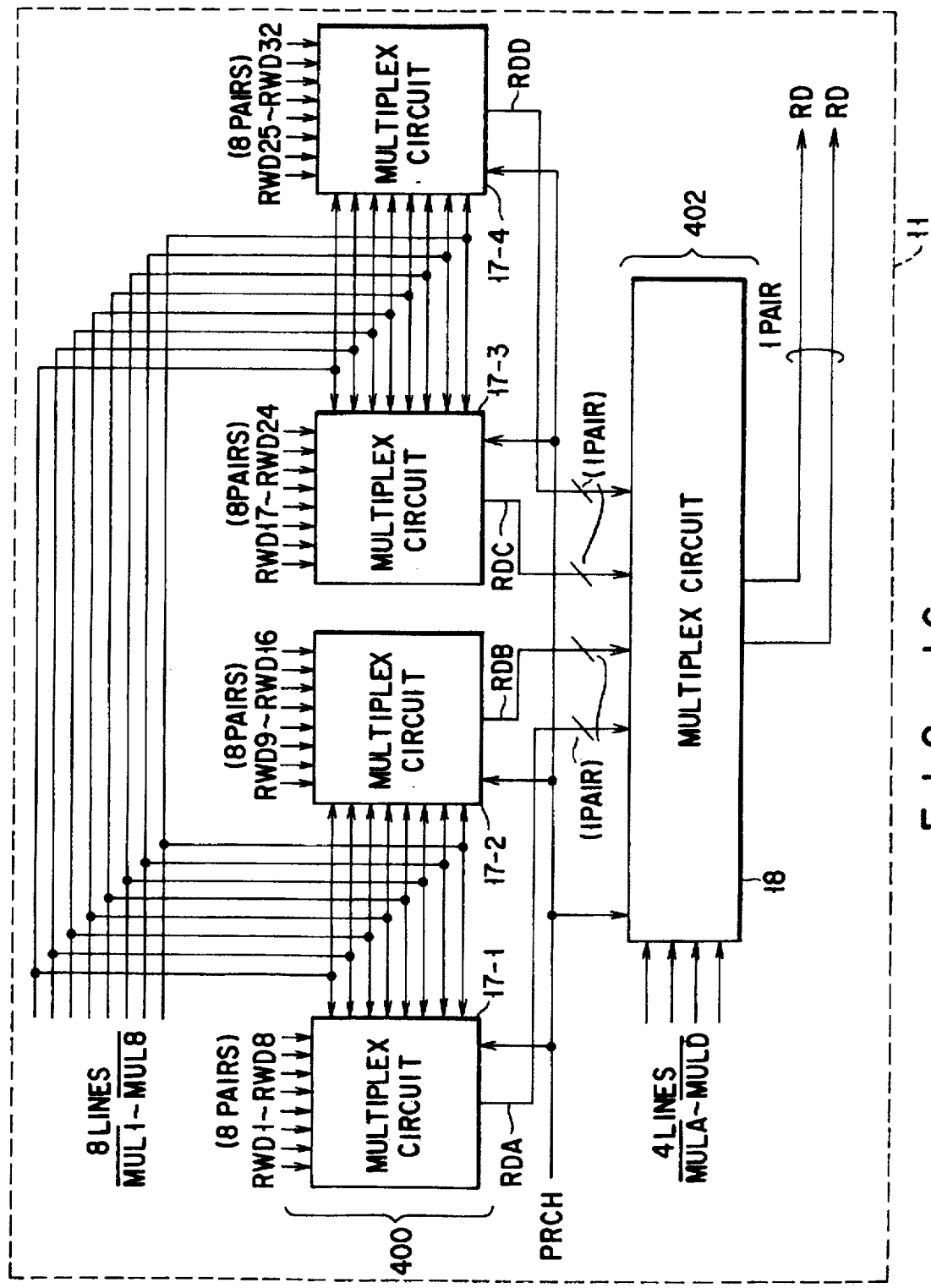
FIG. 16 is a block diagram of the read multiplexer shown in FIG. 14.

FIG. 16 is a block diagram schematically showing the internal arrangement of the read multiplexer 11.

As shown in FIG. 16, the read multiplexer 11 includes a first multiplex stage 400 and a second multiplex stage 402.

The first multiplex stage 400 includes four multiplex circuits 17-1 to 17-4. The multiplex circuit 17-1 multiplexes the eight read/write data line pairs RWD1 to RWD8 connected to the 16 Mbit-cell array A to an internal read line pair RDA on the basis of the multiplex signals BMUL1 to BMUL8. The multiplex circuit 17-2 multiplexes the eight read/write data line pairs RWD9 to RWD16 connected to the 16 Mbit-cell array B to an internal read line pair RDB on the basis of the multiplex signals BMUL1 to BMUL8. The multiplex circuit 17-3 multiplexes the eight read/write data line pairs RWD17 to RWD24 connected to the 16 Mbit-cell array C to an internal read line pair RDC on the basis of the multiplex signals BMUL1 to BMUL8. The multiplex circuit 17-4 multiplexes the eight read/write data line pairs RWD25 to RWD32 connected to the 16 Mbit-cell array D to an internal read line pair RDD on the basis of the multiplex signals BMUL1 to BMUL8.

The second multiplex stage 402 includes a multiplex circuit 18. The multiplex circuit 18 multiplexes the four internal read line pairs RDA to RDD to the read data line pair RD on the basis of the multiplex signals BMULA to BMULD.

Figure 17:
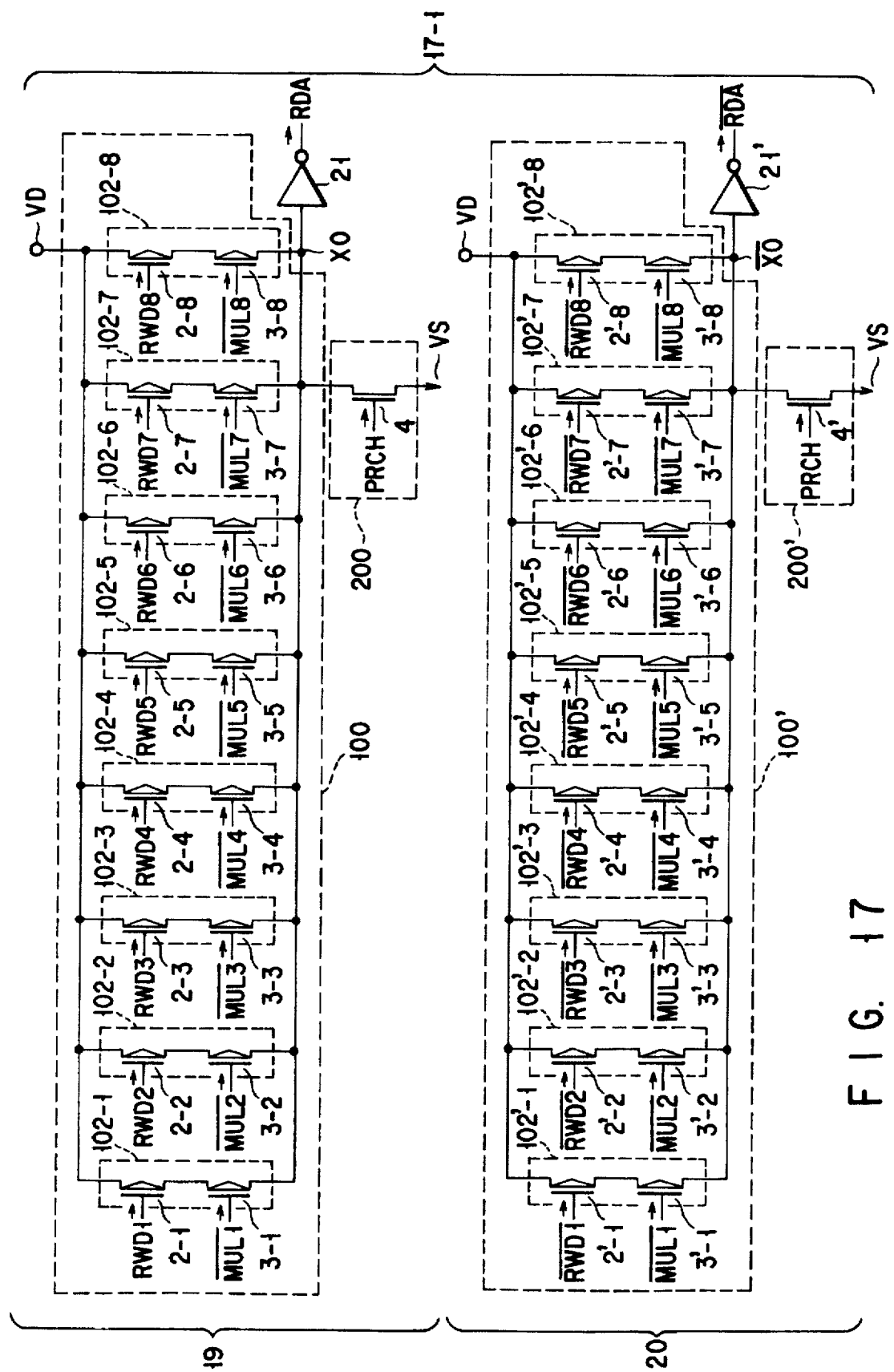
FIG. 17 is a circuit diagram of the multiplex circuit of a first multiplex stage shown in FIG. 16.

FIG. 17 is a circuit diagram of the multiplex circuit 17-1 included in the first multiplex stage 400. The remaining multiplex circuits 17-2 to 17-4 included in the first multiplex stage 400 have almost the same circuit arrangement except that the to-be-input read/write data line pairs are different from those of the multiplex circuit 17-1. Therefore, as for the circuit arrangement of the multiplex circuit, only the multiplex circuit 17-1 included in the first multiplex stage 400 will be exemplified and described below.

The multiplex circuit 17-1 includes a positive-phase signal multiplex circuit 19 for integrating the eight read/write data lines RWD1 to RWD8 to the internal read data line RDA, and an inverted signal multiplex circuit 20 for integrating the eight inverted read/write data lines BRWD1 to BRWD8 to the inverted internal read data line RDA.

The positive-phase signal multiplex circuit 19 has the same arrangement as that of the device shown in FIG. 3 except that the number of series circuits 102 constituted by a data signal transmission PMOS group 2 (2-1 to 2-8) and an output selecting PMOS group 3 (3-1 to 3-8) and parallelly arranged is increased from four to eight, the data signals A to D are replaced with the read/write data signals RWD1 to RWD8, and the selecting signals Ba to Bd are replaced with the multiplex signals BMUL1 to BMUL8.

The input terminal of an inverter 21 is connected to a common node $X_0$. The inverter 21 outputs the internal read data signal RDA as an output signal.

In FIG. 17, reference symbol VD denotes a high potential power supply (the potential VDD in this embodiment) in the integrated circuit, and reference symbol VS denotes a low potential power supply (the ground potential GND in this embodiment) in the integrated circuit.

The inverted signal multiplex circuit 20 has the same arrangement as that of the positive-phase signal multiplex circuit 19. Since this circuit is used for negative-phase signals, the read/write data signals RWD1 to RWD8 are replaced with the inverted read/write data signals BRWD1 to BRWD8.

As for the circuit elements of the negative-phase signal multiplex circuit 20, data signal transmission PMOSs, output selecting PMOSs, an NMOS for precharging a common node $BX_0$, and an inverter whose input terminal is connected to the common node are denoted by reference numerals 2'-1 to 2'-8, 3'-1 to 3'-8, 4' and 21' to correspond to the circuit elements of the positive-phase signal multiplex circuit 19, and a detailed description thereof will be omitted.

Figure 18:
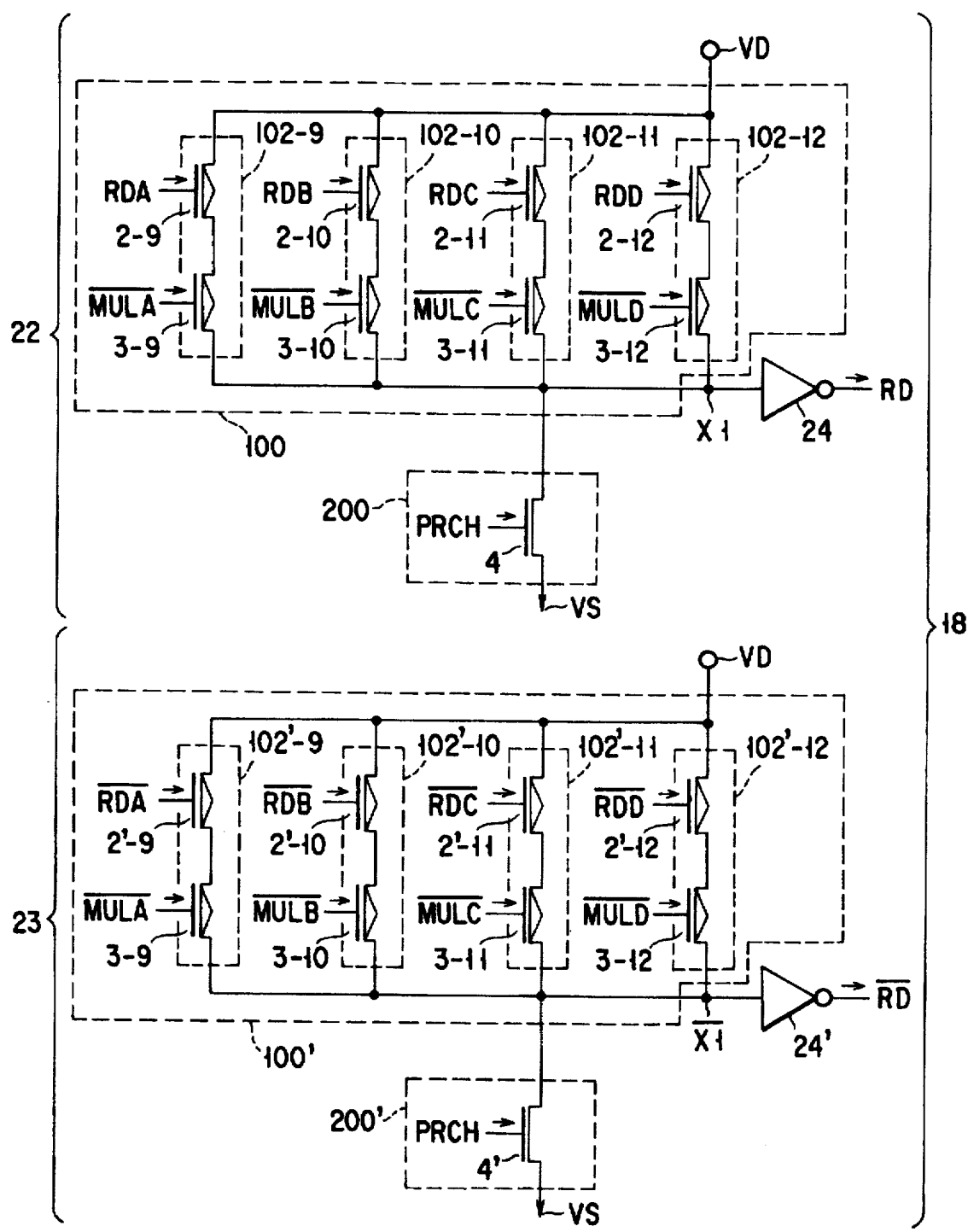
FIG. 18 is a circuit diagram of the multiplex circuit of a second multiplex stage shown in FIG. 16.

FIG. 18 is a circuit diagram of the multiplex circuit 18 included in the second multiplex stage 402.

Like the multiplex circuits 17-1 to 17-4, the multiplex circuit 18 includes a positive-phase signal multiplex circuit 22 and an inverted signal multiplex circuit 23. The multiplex circuit 22 integrates the four internal read data lines RDA to RDD to a read data line RD. The multiplex circuit 23 integrates the four inverted internal read data lines BRDA to BRDD to an inverted read data line BRD.

The positive-phase signal multiplex circuit 22 has the same arrangement as that of the device shown in FIG. 3 except that the internal read data signals RDA to RDD are supplied to the data signal transmission PMOS group 2 (2-9 to 2-12), and the multiplex signals BMULA to BMULD are supplied to the output selecting PMOS group 3 (3-9 to 3-12).

The input terminal of an inverter 24 is connected to a common node $X_1$. The inverter 24 outputs the read data signal RD as an output signal.

The inverted signal multiplex circuit 23 has the same arrangement as that of the positive-phase signal multiplex circuit 22. Since this circuit is used for negative-phase signals, inverted internal read data signals BRDA to BRDD are supplied to the gates of the data signal transmission PMOSs 2-9 to 2-12.

As for the circuit elements of the negative-phase signal multiplex circuit 23, data signal transmission PMOSs, output selecting PMOSs, the NMOS for precharging a common node $BX_1$, and the inverter whose input terminal is connected to the common node are denoted by reference numerals 2'-9 to 2'-12, 3'-9 to 3'-12, 4', and 21' to correspond to the circuit elements of the positive-phase signal multiplex circuit 22, and a detailed description thereof will be omitted.

In the read multiplexer, the multiplex circuit is divided into a plurality of stages. When the multiplex circuit is divided into the plurality of stages, the parasitic capacitances added to the read data line pair RD can be further decreased as compared to a case wherein one of the 32 read/write data line pairs RWD is selected and connected to the read data line pair RD by a multiplex circuit of one stage.

Each of the output signal lines of the multiplex circuits 17-1 to 17-4 included in the first multiplex stage 400, i.e., each of the four read data line pairs RDA to RDD has one output buffer, and a total of four output buffers are arranged. The multiplex circuit 18 included in the second multiplex stage 402 is set inactive, and one read data line pair is connected to one output buffer. With this arrangement, a DRAM with a ×4 bit arrangement can be obtained in place of a DRAM with a ×1 bit arrangement.

When the number of output bits is changed by changing the switching function added to the DRAM chip or changing the wiring pattern, both the DRAMs with the ×1 bit arrangement and the ×4 bit arrangement can be obtained from one DRAM chip.

The arrangement in which the multiplex circuit is divided into the plurality of stages is preferable for the present invention because the parasitic capacitances can be decreased, and a DRAM capable of selecting the ×1 bit arrangement or the ×4 bit arrangement can be easily obtained.

FIG. 19 is a block diagram of the read multiplexer of the DRAM capable of changing the number of output bits.

As shown in FIG. 19, a switch circuit group 450 is provided to the read data line pairs RDA to RDD for connecting the first multiplex stage 400 to the second multiplex stage 402. The switch circuit group 450 includes switch circuits 451-1 to 451-4, each of which is provided to the corresponding read data line pair. The switch circuits 451-1 to 451-4 switch and connect the read data line pairs RDA to RDD to the second multiplex stage 402 or an output buffer group 452. This switching operation is performed on the basis of the potential level of a switching signal ×4. The output buffer group 452 includes four output buffers 453-1 to 453-4 corresponding to the four read data line pairs RDA to RDD. The output buffer 453-1 is used in both the ×1 bit arrangement and the ×4 bit arrangement. For this reason, the output buffer 453-1 is connected to the read data line pair RD and the switch circuit 451-1 through a switch circuit 454. The switch circuit 454 also performs the same switching operation as in the switch circuits 451-1 to 451-4. This switching operation is also performed on the basis of the potential level of the switching signal ×4. The remaining output buffers 453-2 to 453-4 are used only in the ×4 bit arrangement.

The multiplex signals BMULA to BMULD and the precharge signal PRCH are supplied to the multiplex circuit 18 of the second multiplex stage 402 through a signal inactivating circuit 455. The signal inactivating circuit 455 includes OR gate circuits 456-1 to 456-4 and AND gate circuit 456-5, each of which is provided to the corresponding signal line. Each of the signals BMULA to BMULD is supplied to one input terminal of a corresponding one of the OR gate circuits 456-1 to 456-4. The signal PRCH is supplied to one input terminal of the AND gate circuit 456-5. The switching signal B×4 is supplied to the other input terminal of the OR gate circuits 456-1 to 456-4. The switching signal ×4 is supplied to the other input terminal of the AND gate circuit 456-5.

When the switching signal ×4 is at high level, outputs from the OR gate circuits 456-1 to 456-4 and the AND gate circuit 456-5 change in accordance with the potential levels of the signals BMULA to BMULD and PRCH, respectively. For this reason, the multiplex circuit 18 is activated.

When the switching signal ×4 is at low level, outputs from the OR gate circuits 456-1 to 456-4 are fixed at high level and output from the AND gate circuit 456-5 is fixed at low level. When outputs from the OR gate circuits 456-1 to 456-4 are fixed at high level, the PMOSs 3-9 to 3-12 and 3'-9 to 3'-12 of the multiplex circuit 18 shown in FIG. 18 are turned off. At the same time, the NMOSs 4 and 4' are turned on. For this reason, the potentials of the common nodes $X_1$ and $BX_1$ are fixed at low level, and the multiplex circuit 18 is set inactive.

FIG. 20 is a circuit diagram of the switch circuit shown in FIG. 19. FIG. 20 particularly shows the switch circuit 451-1 and the switch circuit 454.

As shown in FIG. 20, the switch circuit 451-1 includes four CMOS transfer gate circuits 470-1 to 470-4. The switching signal ×4 is supplied to the PMOS gate of the gate circuit 470-1, the PMOS gate of the gate circuit 470-2, the NMOS gate of the gate circuit 470-3, and the NMOS gate of the gate circuit 470-4. An inverted switching signal B×4 is supplied to the NMOS gate of the gate circuit 470-1, the NMOS gate of the gate circuit 470-2, the PMOS gate of the gate circuit 470-3, and the PMOS gate of the gate circuit 470-4.

In this switch circuit 451-1, when the switching signal ×4 is at high level, the gate circuits 470-3 and 470-4 are turned on while the gate circuits 470-1 and 470-2 are turned off. For this reason, the read data lines RDA and BRDA are connected to the multiplex circuit 18.

When the switching signal ×4 is at low level, the gate circuits 470-1 and 470-2 are turned on while the gate circuits 470-3 and 470-4 are turned off. For this reason, the read data lines RDA and BRDA are connected to the switch circuit 454.

The switch circuit 454 includes four CMOS transfer gate circuits 471-1 to 471-4. The switching signal ×4 is supplied to the PMOS gate of the gate circuit 471-1, the PMOS gate of the gate circuit 471-2, the NMOS gate of the gate circuit 471-3, and the NMOS gate of the gate circuit 471-4. The inverted switching signal B×4 is supplied to the NMOS gate of the gate circuit 471-1, the NMOS gate of the gate circuit 471-2, the PMOS gate of the gate circuit 471-3, and the PMOS gate of the gate circuit 471-4.

In this switch circuit 454, when the switching signal ×4 is at high level, the gate circuits 471-3 and 471-4 are turned on while the gate circuits 471-1 and 471-2 are turned off. For this reason, the read data lines RD and BRD are connected to the output buffer 453-1.

When the switching signal ×4 is at low level, the gate circuits 471-1 and 471-2 are turned on while the gate circuits 471-3 and 471-4 are turned off. For this reason, the read data lines RDA and BRDA are connected to the output buffer 453-1 through the switch circuit 451-1.

The remaining switch circuits 451-2 to 451-4 have almost the same arrangement as that of the switch circuit 451-1 except that they are directly connected to the output buffers 453-2 to 453-4 without interposing the switch 454, and the circuit diagrams of the switch circuits 451-2 to 451-4 will be omitted.

In the DRAM having the read multiplexer shown in FIGS. 19 and 20, a DRAM with a ×1 bit arrangement can be obtained by setting the switching signal ×4 at high level. Alternatively, a DRAM with a ×4 bit arrangement can be obtained by setting the switching signal ×4 at low level.

A normal read operation by the read multiplexer will be described below. In the following description, a DRAM with a ×1 bit arrangement is exemplified.

Figure 22:
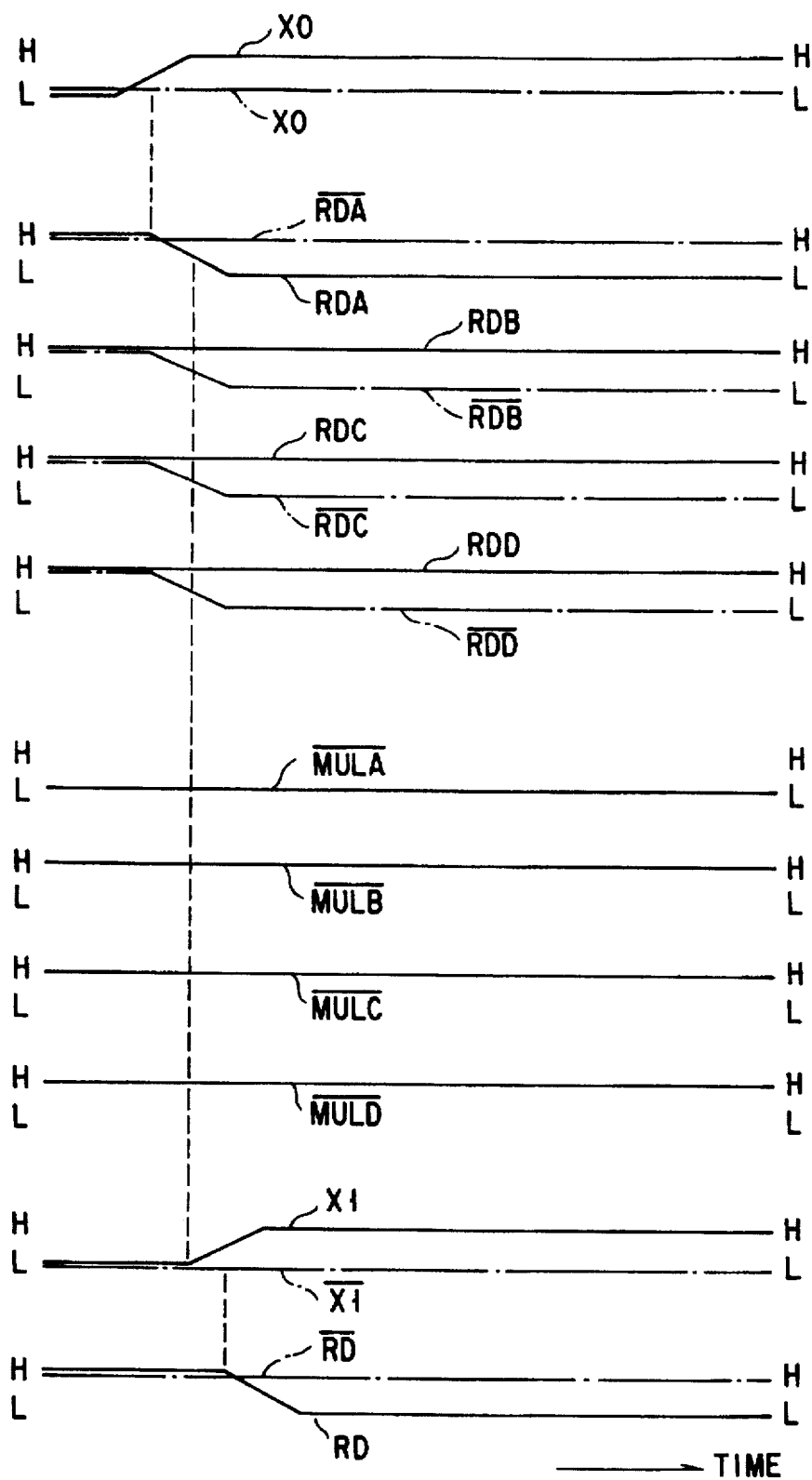

FIGS. 21 and 22 are charts of operating waveforms showing the operation of the read multiplexer 11.

As shown in FIG. 21, all the read/write data line pairs RWD1 to RWD8 are set at high (H) level first. This is because all the read/write data line pairs RWD1 to RWD8 are charged with the high potential VCC in advance by the precharge circuit 308 shown in FIG. 12. The precharge signal PRCH for precharging the read multiplexer 11 is set at high level. As for the multiplex signals BMUL1 to BMUL8, only the multiplex signal BMUL2 is set at low (L) level while the remaining signals are at high level.

In this state, the precharge signal of high level goes to low level. With this operation, the read multiplexer 11 is activated. Subsequently, data in the memory cell is read out to the read/write data line pairs RWD1 to RWD8. At this time, the potential of one line of each line pair goes to low level. In FIG. 21, for example, the read/write data line RWD1 is kept at high level while the inverted read/write data line BRWD1 goes to low level. The potential of the read/write data line RWD2 goes to low level while the inverted read/write data line BRWD2 is kept at high level.

When the potential differences are generated in the read/write data line pairs RWD, the data signal is read out to the read/write data line pairs RWD.

When the data signal is read out up to the read/write data line pairs RWD, the data signal is supplied to the multiplex circuits 17-1 to 17-4 of the first multiplex stage 400 in the read multiplexer 11. Only the two read/write data line pairs RWD1 and RWD2 will be exemplified and described below.

The PMOS 2-1 of the multiplex circuit 17-1 shown in FIG. 17 is turned off because the data signal RWD1 is at high level. To the contrary, the PMOS 2'-1 is turned on because the data signal BRWD1 is at low level. The PMOS 2-2 is turned on because the data signal RWD2 is at low level. To the contrary, the PMOS 2'-2 is turned off because the data signal BRWD2 is at high level. The multiplex signals BMUL1 to BMUL8 for the first multiplex stage are supplied to the multiplex circuit 17-1. Only the multiplex signals BMUL1 and BMUL2 will be exemplified and described. The PMOSs 3-1 and 3'-1 are turned off because the signal BMUL1 is at high level. To the contrary, the PMOSs 3-2 and 3'-2 are turned on because the signal BMUL2 is at low level. Therefore, only the line pair RWD2 is selected from the eight read/write data line pairs RWD. This line pair RWD2 is electrically connected to the internal read/write data line pair RDA.

The data of the read/write data line pair RWD2 is transmitted to the internal read/write data line pair RDA depending on whether the common node $X_0$ or $BX_0$ is charged. In FIG. 21, since the read/write data line RWD2 is at low level, and the inverted read/write data line BRWD2 is at high level, the common node $X_0$ is charged to high level while the common node $BX_0$ is kept at low level. The potentials of the common nodes $X_0$ and $BX_0$ are supplied to the inverters 21 and 21', respectively. Only the inverter 21 inverts the potential of an output signal, so that only the internal read data line RDA goes to low level while the potential of the inverted internal read data line BRDA is kept at high level, as shown in FIG. 22.

This operation is parallelly performed in the three remaining multiplex circuits 17-2 to 17-4, and potential differences are generated in the internal read data line pairs RDA to RDD. With this operation, the data signal is read out up to the internal read data line pairs RDA to RDD.

When the data signal is read out up to the internal read data line pairs RDA to RDD, the data is supplied to the multiplex circuit 18 of the second multiplex stage 402 in the read multiplexer 11. The multiplex signals BMULA to BMULD for the second multiplex stage are supplied to the multiplex circuit 18. As shown in FIG. 22, as for the multiplex signals BMULA to BMULD, only the signal BMULA is at low level while the remaining signals are at high level. More specifically, the PMOSs 3-9 and 3'-9 shown in FIG. 18 are turned on while the remaining output selecting PMOSs 3 are turned off. Therefore, only one pair RDA is selected from the four internal read data line pairs. This pair is electrically connected to the read data line pair RD.

The data of the internal read data line pair RDA is transmitted to the read data line pair RD depending on whether the common node $X_1$ or $BX_1$ is charged. In FIG. 22, since the internal read data line RDA is at low level while the inverted internal read data line BRDA is at high level, the common node $X_1$ is charged to high level while the common node $BX_1$ is kept at low level. The potentials of the common nodes $X_1$ and $BX_1$ are supplied to the inverters 24 and 24', respectively. Only the inverter 24 inverts the potential of an output signal, so that only the read data line RD goes to low level while the potential of the read data line BRD is kept at high level, as shown in FIG. 22.

When the potential difference is generated in the read data line pair RD, the data signal is read out up to the read data line pair RD. The data signal read out up to the read data line pair RD is supplied to the output buffer.

In a DRAM with a ×4 bit arrangement, the second multiplex stage 402 does not operate, and the signal read out up to the internal read data line pairs RDA to RDD is directly supplied from the first multiplex stage 400 to the output buffer.

A test circuit will be described below.

As shown in FIG. 9, a test circuit (T.C) is arranged between the read multiplexer & write multiplexer and the output buffer. A selecting circuit (S.C) is arranged between the test circuit (T.C) and the output buffer. In a normal read operation, the selecting circuit (S.C) electrically directly connects the read data line RD and the inverted read data line BRD to the input terminal of the output buffer. On the other hand, in a test read operation, the selecting circuit (S.C) supplies the read data line RD and the inverted read data line BRD to the test circuit (T.C) and electrically connects an output result representing the test result from the test circuit (T.C) to the input terminal of the output buffer.

Figure 23:
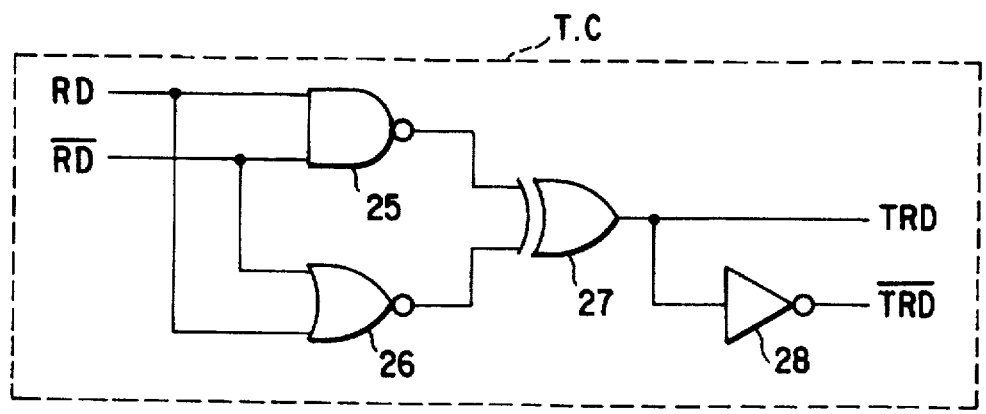
FIG. 23 is a circuit diagram of a test circuit shown in FIG. 9.

FIG. 23 is a circuit diagram of the test circuit shown in FIG. 9.

As shown in FIG. 23, the test circuit (T.C) includes a two-input NAND gate 25 for receiving the read data line RD and the inverted read data line BRD, a two-input NOR gate 26 for receiving the read data line RD and the inverted read data line BRD, and an XOR (exclusive OR) gate 27 for receiving an output from the NAND gate 25 and an output from the NOR gate 26.

The output terminal of the XOR gate 27 is connected to a test read data line TRD and also connected to an inverted test read data line BTRD through an inverter 28.

Figure 24:
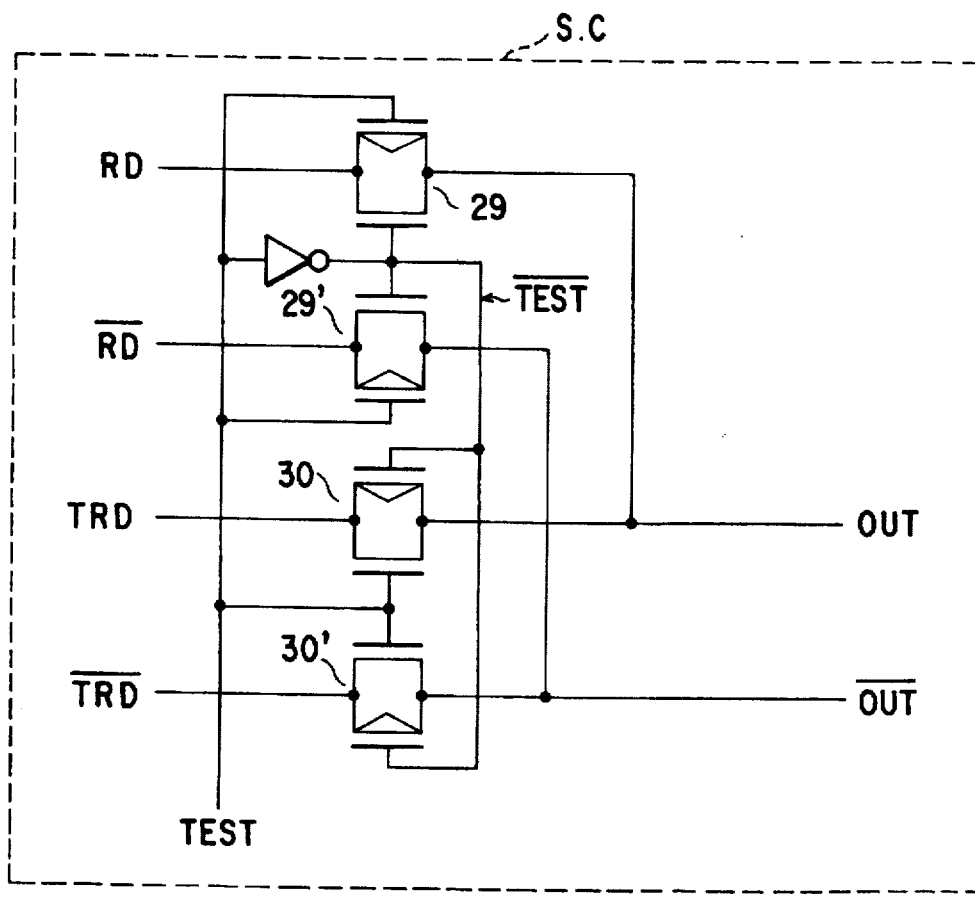
FIG. 24 is a circuit diagram of a selecting circuit shown in FIG. 9.

FIG. 24 is a circuit diagram of the selecting circuit shown in FIG. 9.

As shown in FIG. 24, the selecting circuit (S.C) includes a CMOS transfer gate 29 whose input terminal is connected to the read data line RD, a CMOS transfer gate 29' whose input terminal is connected to the inverted read data line BRD, a CMOS transfer gate 30 whose input terminal is connected to the test read data line TRD, and a CMOS transfer gate 30' whose input terminal is connected to the inverted test read data line BTRD.

The test signal TEST is supplied to the PMOS gate of the transfer gate 29 and the PMOS gate of the transfer gate 29'. An inverted test signal BTEST is supplied to the NMOS gate of the transfer gate 29 and the NMOS gate of the transfer gate 29'. The inverted test signal BTEST is input to the PMOS gate of the transfer gate 30 and the PMOS gate of the transfer gate 30'. The test signal TEST is supplied to the NMOS gate of the transfer gate 30 and the NMOS gate of the transfer gate 30'. The transfer gates 29 and 29' are turned on in a normal operation, i.e., only when the test signal TEST is at low level. The transfer gates 30 and 30' are turned on in a test operation, i.e., only when the test signal TEST is at high level. Therefore, the selecting circuit electrically connects the read data line pair RD to an output line pair OUT in the normal operation. On the other hand, the selecting circuit electrically connects the test read data line pair TRD to the output line pair OUT in the test operation.

An operation in the test mode will be described below.

In a test read mode, the data signal (to be referred to as a 32-bit data signal) is simultaneously read out to all the 32 read/write data line pairs RWD. Thereafter, the 32-bit data signal is supplied to the multiplex circuits 17-1 to 17-4 of the first multiplex stage 400. The first OR operation is performed, and the ORed data signal is supplied to the multiplex circuit 18 of the second multiplex stage 402 to be subjected to the second OR operation. This operation is performed in the test mode to set the test signal at high level and all the 12 multiplex signals BMUL1 to BMUL8 and BMULA to BMULD at low level (full selection state), as shown in FIG. 15. The data signal subjected to the second OR operation is read out to the read data line pair RD.

In the test read mode, identical data are written in a plurality of memory cells. The data are simultaneously read out from the plurality of memory cells. For this reason, the 32-bit data signals read from the memory cells must be identical.

If the 32-bit signals read out from the memory cells have no error, one of the read data line RD and the inverted read data line BRD always has a potential of high level, and the other always has a potential of low level.

This phenomenon will be briefly described. FIG. 25 is a circuit diagram schematically showing the multiplex circuit 17-1 shown in FIG. 17. Since an 8-bit data signal is shown in FIG. 17, the 8-bit data signal is shown in FIG. 25 as well. If all the 8-bit signals are identical, all the PMOSs 2'-1 to 2'-8 are turned on upon turning off the PMOSs 2-1 to 2-8, as shown in FIG. 25. This phenomenon is also observed in the remaining multiplex circuits 17-2 to 17-4. For this reason, the potentials of all the internal read data lines RDA to RDD go to high level while the potentials of all the inverted internal read data lines BRDA to BRDD go to low level. This means that all the input data signals to the multiplex circuit 18 are identical. Therefore, one of the read data line RD and the inverted read data line BRD has a potential of high level while the other has a potential of low level.

The ORed data signal is supplied to the test circuit (T.C) shown in FIG. 23. At this time, the NAND gate 25 outputs a signal of high level, and the NOR gate 26 outputs a signal of low level. Therefore, the signal of high level and the signal of low level are supplied to the XOR gate 27, and the XOR gate 27 outputs a signal of high level. The potential of the test read data line TRD goes to high level while the potential of the inverted test read data line BTRD goes to low level. With this operation, the tested data signal is read out to the test read data line pair TRD. The tested data signal is supplied to the output buffer through the selecting circuit (S.C). Thereafter, an output pad (not shown) connected to the output terminal of the output buffer outputs data of, e.g., "H".

If any one of the 32-bit data signals read out from the memory cells has an error, both the read data line RD and the inverted read data line BRD go to low level.

This phenomenon will be briefly described. FIG. 26 is a circuit diagram schematically showing the multiplex circuit 17-1 shown in FIG. 17, as in FIG. 25. Assume that one of the 8-bit data signals has an error, and only the PMOS 2-4 is turned on. In this case, a current flows to charge the common node $X_0$ to high level. For this reason, the potential of the internal read data line RDA goes to low level. The inverted internal read data line BRDA is at low level, as a matter of course. This means that one of the input data signals RDA to RDD and BRDA to BRDD to the multiplex circuit 18 has an error. The PMOS of the multiplex circuit 18, which receives the input data signal with an error, is turned on like the PMOS 2-4 shown in FIG. 26. Therefore, both the read data line RD and the inverted read data line BRD have potentials of low level.

The ORed data signal is supplied to the test circuit (T.C) shown in FIG. 23. At this time, the NAND gate 25 outputs a signal of high level, and the NOR gate 26 goes to low level and outputs a signal of high level. For this reason, the signals of high level are supplied to the XOR gate 27, and the XOR gate 27 outputs a signal of low level. Contrary to the above case, the test read data line TRD has a potential of low level while the inverted test read data line BTRD has a potential of high level. Therefore, contrary to the above case, the output pad (not shown) outputs data of, e.g., "L".

As described above, in the integrated circuit device according to the present invention, when all the multiplex signals are set in a selection state, and all the input data signals are input, the input data signals can be ORed. By using the OR operation function to constitute the test circuit of a DRAM, the test circuit can be simplified.

The write multiplexer will be described below.

FIG. 27 is a block diagram of the write multiplexer shown in FIG. 14.

As shown in FIG. 27, the write multiplexer 12 includes read/write data line pair selecting circuits 31, each of which is provided to the corresponding one of the 32 read/write data line pairs. Since the DRAM according to this embodiment has the 32 read/write data line pairs RWD1 to RWD32, there are 32 selecting circuits 31-1 to 31-32.

Each of the 32 selecting circuits 31 includes a read/write data line pair driving circuit 35 (35-1 to 35-32) for driving the read/write data line pair, and a driving circuit activating circuit (A.C) 32 (32-1 to 32-32) for selecting and activating one of the 32 driving circuits 35-1 to 35-32 on the basis of the multiplex signals BMUL1 to BMUL8 and BMULA to BMULD. Each of the selecting circuits 32-1 to 32-32 is provided to the corresponding one of the driving circuits 35-1 to 35-32.

Each of the 32 driving circuits 35 includes an inverter 36 (36-1 to 36-32) whose input terminal is connected to the write data line WD while the output terminal is connected to the read/write data line RWD, and an inverter 37 (37-1 to 37-32) whose input terminal is connected to the inverted write data line BWD while the output terminal is connected to the inverted read/write data line BRWD. The inverter 36 outputs a signal to the read/write data line RWD only when an output signal φ from the activating circuit (A.C) 32 and an inverted signal Bφ are received. The inverter 37 also outputs a signal to the inverted read/write data line BRWD only when the output signal φ from the activating circuit (A.C) 32 and the inverted signal Bφ are received.

FIG. 28 is a circuit diagram of the selecting circuit shown in FIG. 27. FIG. 28 particularly shows the selecting circuit 31-1.

As shown in FIG. 28, the activating circuit 32-1 includes a three-input OR gate 33 and a two-input NAND gate 34. The multiplex signals BMUL1 and BMULA and a write timing signal WRT are supplied to the OR gate 33. An output from the OR gate and the inverted test signal BTEST are supplied to the NAND gate 34. The NAND gate 34 outputs the output signal φ of the activating circuit 32.

In a normal mode, the inverted test signal BTEST is set at high level. For this reason, the activating circuit 32-1 outputs an output signal of the OR gate, whose potential level is inverted, from the output terminal of the NAND gate 34. More specifically, the potential level of the output signal φ from the activating circuit 32-1 is determined by the potential level of the output from the OR gate 33.

In a test mode, the inverted test signal BTEST is set at low level. For this reason, an output from the NAND gate 34 is always set at high level independently of the output level of the OR gate 33. More specifically, the activating circuit 32-1 has the same function as that of the gate circuits 14-1 to 14-12, shown in FIG. 15, for outputting the multiplex signals.

The remaining activating circuits 32-2 to 32-32 also have the same circuit arrangement as that of the activating circuit 32-1 except that different multiplex signals are supplied.

The write operation will be described below.

In a normal write mode, one of the activating circuits 32-1 to 32-32 outputs a potential of high level to activate the corresponding one of the driving circuits 35-1 to 35-32. With this operation, one write data line pair WD is electrically connected to one read/write data line pair RWD. The data signal from the outside the chip is supplied to the selected read/write data line pair RWD. Thereafter, the supplied data signal is supplied to the data line pair DQ through a write DQ buffer (not shown) and supplied to the bit line pair BL through the DQ gate. In this manner, the data is written in a write-selected memory cell.

In a test write mode, all the activating circuits 32-1 to 32-32 output potentials of high level to activate all the driving circuits 35-1 to 35-32. With this operation, one write data line pair WD is electrically connected to all the read/write data line pairs RWD. The data signal from the outside of the chip is supplied to all the read/write data line pairs RWD. Thereafter, the supplied data signal is supplied to the 32 data line pairs DQ through the write DQ buffer (not shown) and supplied to the 32 bit line pairs BL through the DQ gate. In this manner, the identical data are written in all the write-selected memory cells.

A 64 Mbit DRAM according to the third embodiment of the present invention will be described below.

FIG. 29 is a block diagram schematically showing a DRAM according to the third embodiment of the present invention. FIG. 30 is a block diagram showing one of 16 Mbit-cell arrays shown in FIG. 29 in more detail.

The DRAM according to the third embodiment is basically the same as the DRAM according to the first embodiment except that five pairs of column addresses (A8C to A12C and BA8C to BA12C) are supplied to the cell array and a DQ buffer, and a test signal TEST is supplied to the DQ buffer. In this case, one of four read/write data line pair groups RWD1 to RWD8, RWD9 to RWD16, RWD17 to RWD24, and RWD25 to RWD32 is selected using the four column addresses A11C, A12C, BA11C, and BA12C. One pair of eight read/write data line pairs RWD is selected using the six remaining column addresses A8C to A10C and BA8C to BA10C.

By selecting the read/write data line pair in this manner, in the DRAM according to the third embodiment, only one of the 32 DQ buffers can be operated while the 31 remaining DQ buffers are not operated. A potential difference is generated between the read/write data line RWD connected to the selected DQ buffer and an inverted read/write data line BRWD in accordance with a data signal read out from the memory cell. The read/write data lines RWD and the inverted read/write data lines BRWD, which are connected to the 31 nonselected DQ buffers, are kept at high level.

As described above, when the column addresses are supplied to the cell array and the DQ buffer to select one of the 32 read/write data line pairs RWD, multiplex signals BMUL are not needed to be supplied to the multiplex circuit.

Figure 32:
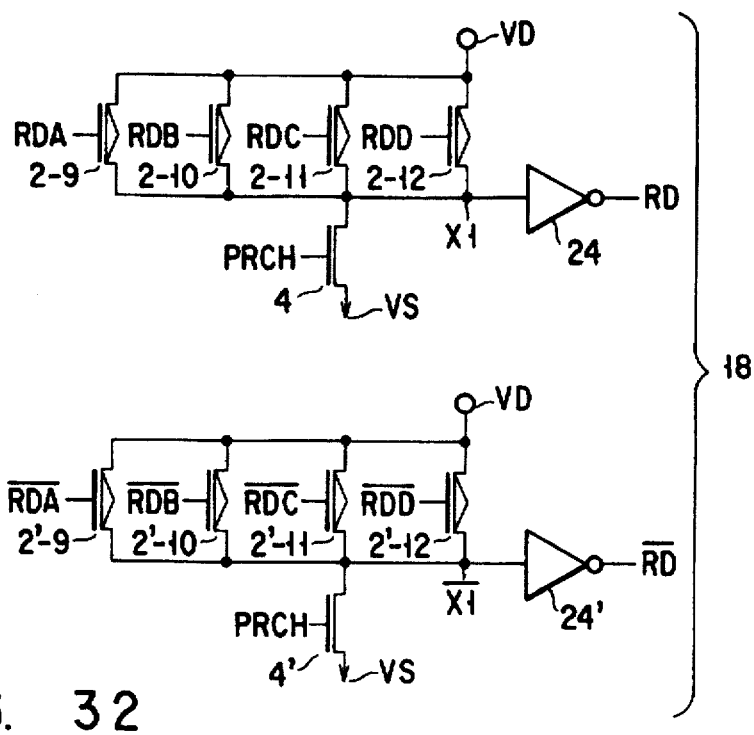
FIG. 32 is a circuit diagram of the multiplex circuit of a second multiplex stage provided to the DRAM according to the third embodiment of the present invention.

FIG. 31 is a circuit diagram of the multiplex circuit of a first multiplex stage provided to the DRAM according to the third embodiment. FIG. 32 is a circuit diagram of the multiplex circuit of a second multiplex stage provided to the DRAM according to the third embodiment.

As shown in FIGS. 31 and 32, the multiplex circuit includes only PMOSs 2 (or PMOSs 2') connected to the read/write data lines RWD. The PMOSs 2 are connected in parallel between a power supply terminal VS and a common node $X_0$ (or a common node $X_1$).

With this arrangement, the scale of the multiplex circuit can be reduced, and a data signal can be quickly selected.

In the DRAM according to the third embodiment, an OR operation in a test mode can be performed as in the second embodiment. More specifically, in the test mode, the 32 DQ buffers are simultaneously operated to read data to all the 32 read/write data line pairs RWD, thereby performing the OR operation.

The operation of the DRAM of the third embodiment in a write mode and the arrangement of a write multiplexer 12 are the same as those in the second embodiment.

With the DRAM according to the second or third embodiment, the following effects can be obtained.

As in the first embodiment, only by turning on/off the data signal transmission PMOS group 2, an integrated circuit device which operates like a multiplex circuit can be obtained. In this integrated circuit device, parasitic capacitances added to the common nodes $X_0$, $X_1$, $BX_0$, and $BX_1$ can be decreased, and the data signal can be transmitted from the read/write data line pair RWD to a read data line pair RD at a high speed.

The above high-speed data signal transmission can be further accelerated by setting the precharge level of the read/write data line pair RWD at a high potential VCC. The reason for this is as follows. In general, the read/write data line pair RWD is a very long signal line arranged along the cell array. Additionally, the read/write data line pair RWD is connected to the transistor of the DQ buffer for reading out the data, so that a junction capacitance is also added. For this reason, the read/write data line pair RWD has a very large parasitic capacitance, and the potential of the read/write data line pair RWD moderately changes. Therefore, in the multiplexer shown in FIGS. 1 or 2, it is difficult to quickly transmit a data signal from the read/write data line pair RWD to the read data line pair RD.

To the contrary, in the integrated circuit device according to the present invention, the data signal transmission PMOS group 2 is turned on when the gate potential goes to a level lower only by VCC−|Vthp| (Vthp represents the threshold voltage of the PMOS 2)|. For this reason, a time from reception of the data signal to the start of charge of the common node X can be shortened. Therefore, a time from reception of the data signal by the read/write data line pair RWD to completion of charge of the common nodes $X_0$, $X_1$, $BX_0$, and $BX_1$ can be shortened.

The integrated circuit device according to the present invention has an OR operation function. The OR operation function is effectively used in, e.g., a test mode. The DRAM has a test time shortening mode by parallel reading in the test mode.

In the integrated circuit device according to the present invention, 32 bits corresponding to the cell arrays are simultaneously tested. In a test write mode, identical data is written in the 32 bits. Thereafter, all the data are parallelly read out. If all the data are identical, a signal of level "1" is output; otherwise, a signal of level "0" is output. With this operation, the test time can be shortened to 1/32 that required in a normal method of testing bit by bit.

In a test read mode, all multiplex signals BMUL1 to BMUL8 and BMULA to BMULD are set at low level. At this time, all the data signals read out to the read/write data line pair RWD are transmitted to the read data line pair RD.

An output from the read data line pair RD is a result of the OR operation, e.g., wired OR, of all the data signals read to the read/write data line pair RWD. More specifically, if all the 32-bit data are identical, the identical data are transmitted to the read data line pair RD as in a normal operation mode. If an error is generated, and the data are not identical, the potential of the read data line pair RD goes to high level. The potential of the read data line pair RD changes depending on the presence/absence of an error. For this reason, the data signal can be discriminated and output to the output circuit depending on the presence/absence of an error.

As described above, the DRAM according to the second or third embodiment can quickly select data in the normal operation mode. In addition, to cope with the test mode, it is sufficient to only change the method of inputting a selecting signal without changing the circuit.

Figure 34:
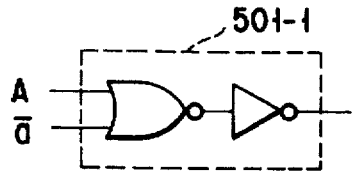
FIG. 34 is a circuit diagram of a selecting circuit shown in FIG. 33.

The multiplex circuit shown in FIGS. 31 or 32 is an application of the integrated circuit device shown in FIG. 34.

Figure 33:
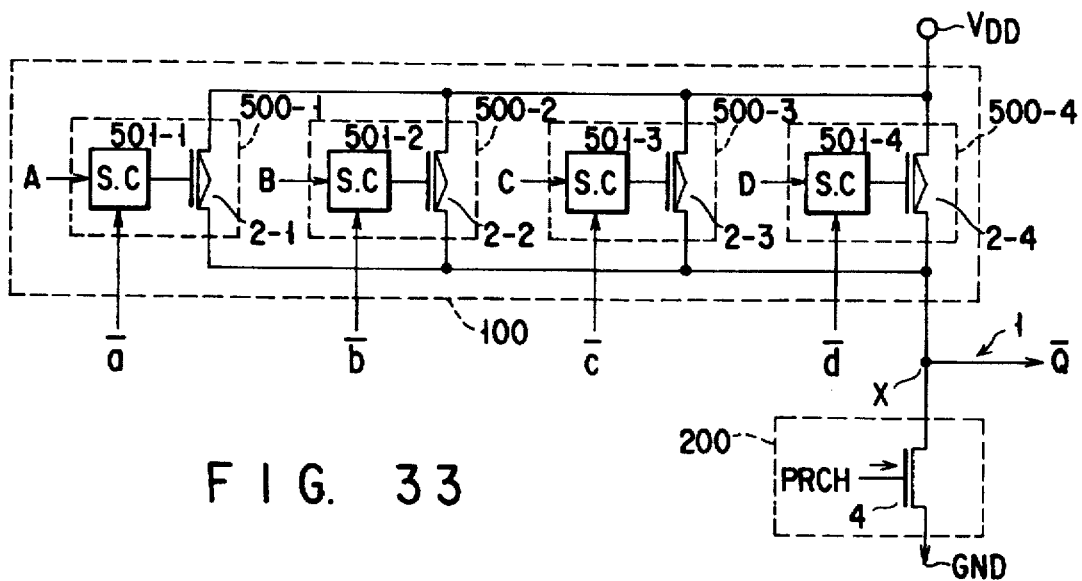
FIG. 33 is a circuit diagram of a semiconductor integrated circuit device according to the fourth embodiment of the present invention.

FIG. 33 is a circuit diagram of a semiconductor integrated circuit device according to the fourth embodiment of the present invention.

As shown in FIG. 33, a data selecting circuit 100 includes a plurality of data transmission circuits 500-1 to 500-4. The plurality of data transmission circuits 500 are parallelly connected between a terminal VDD and a common node X. The plurality of data transmission circuits 500 include selecting circuits 501 for receiving input data signals A to D and selecting signals Ba to Bd, and PMOSs 2 for receiving outputs from the selecting circuits 501.

FIG. 34 is a circuit diagram of the selecting circuit shown in FIG. 33. FIG. 34 particularly shows a selecting circuit 501-1. Remaining selecting circuits 501-2 to 501-4 have the same circuit arrangement as that of the selecting circuit 501-1.

As shown in FIG. 34, the selecting circuit 501-1 includes a NOR gate 502 for receiving the input data signal A and the selecting signal Ba, and an inverter 503 whose input terminal is connected to the output terminal of the NOR gate 502. A signal output from the inverter 503 corresponds to an output signal from the selecting circuit 501-1. When the potential of the selecting signal Ba is at low level, the potential level of an output signal from the NOR gate 502 changes in accordance with the potential level of the input data signal A. When the potential of the selecting signal Ba is at high level, the potential level of the output signal from the NOR gate 502 is fixed at low level independently of the potential level of the input data signal A. Therefore, in the integrated circuit device shown in FIG. 33, when the potentials of the selecting signals Ba to Bd are at low level, the input data signals A to D are transmitted to the gates of the PMOSs 2, thereby performing the same operation as that of the integrated circuit device shown in FIG. 3.

A semiconductor integrated circuit device according to the fifth embodiment of the present invention will be described below.

Figure 35:
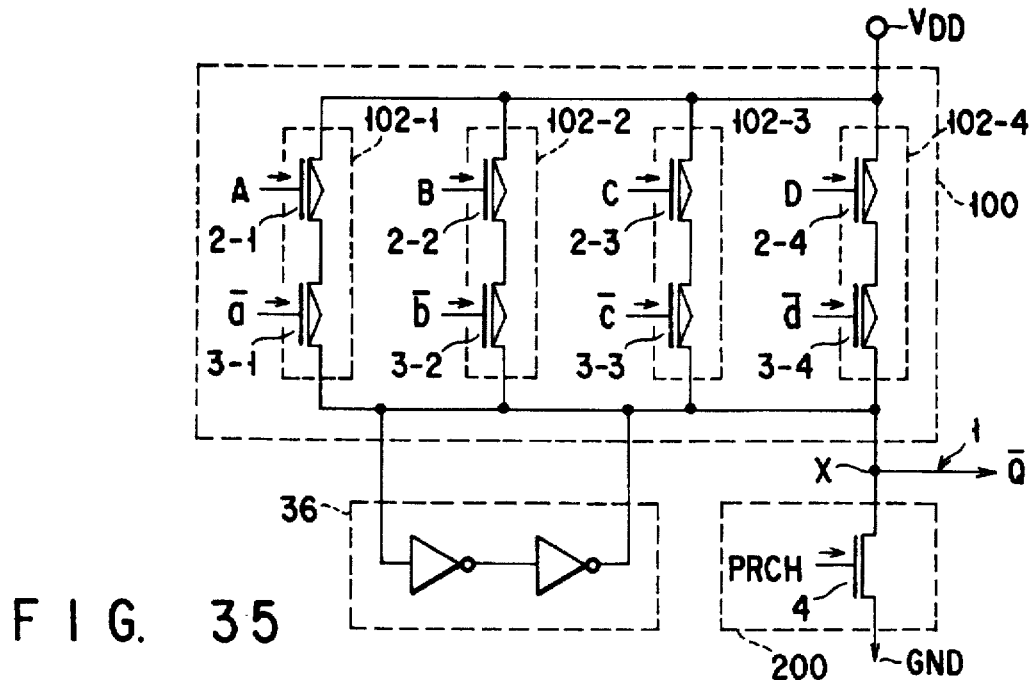
FIG. 35 is a circuit diagram of a semiconductor integrated circuit device according to the fifth embodiment of the present invention.

FIG. 35 is a circuit diagram of the semiconductor integrated device according to the fifth embodiment of the present invention.

The device according to the fifth embodiment shown in FIG. 35 basically has the same arrangement and operational principle as those of the device according to the first embodiment except that a small latch circuit 36 is added to a common node X.

The common node X is set at a low floating level when a precharge signal PRCH is stopped to turn off a precharge NMOS 4. The small latch circuit 36 fixes the potential of the common node X at low level (ground potential in this embodiment) while the common node X is at a low floating level such that the potential of the common node X does not change due to noise or the like.

In the integrated circuit device according to the present invention, if one signal selected from data signals A to D is at high level, the common node X must be kept at low level for a long time even after the data signal is transmitted. For this reason, the small latch circuit 36 is effectively connected to the common node X to stabilize the operation and prevent an erroneous operation such as erroneous data reading.

The "small" latch circuit 36 means a weak latch circuit whose output potential level is quickly inverted. More specifically, when a PMOS group 2 and a PMOS group 3 are turned on, and the potential of the common node X starts to go to high level, this increase is quickly detected to invert the output potential level.

The above weak latch circuit is used as the latch circuit 36 for fixing the potential of the common node X. In this case, when data is supplied to the common node X, the output potential level can be immediately inverted, thereby preventing high-speed data transmission from being impaired.

The latch circuit 36 shown in FIG. 35 can also be connected to common nodes $X_0$ and $BX_0$ shown in FIG. 31, common nodes $X_1$ and $BX_1$ shown in FIG. 32, or the common node X shown in FIG. 33.

A semiconductor integrated circuit device according to the sixth embodiment of the present invention will be described below.

Figure 36:
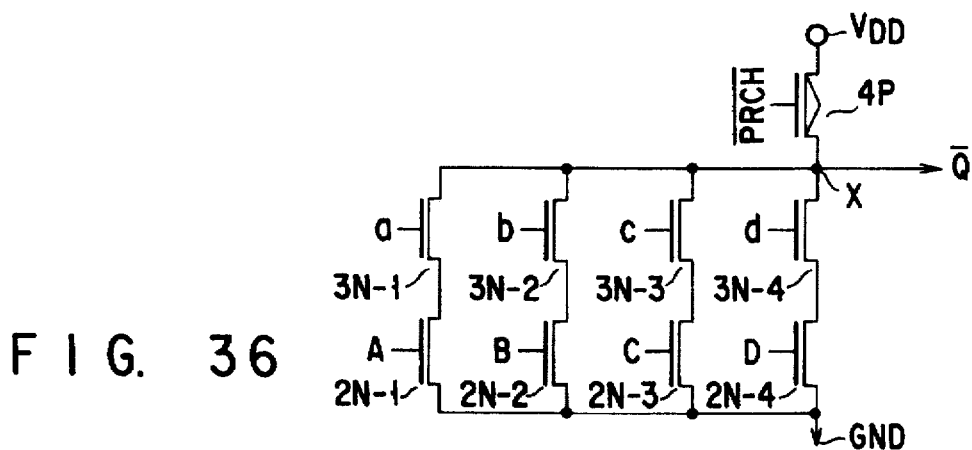
FIG. 36 is a circuit diagram of a semiconductor integrated circuit device according to the sixth embodiment of the present invention.

FIG. 36 is a circuit diagram of the semiconductor integrated device according to the sixth embodiment of the present invention.

In the integrated circuit according to the sixth embodiment shown in FIG. 36, the conductivity types of all the MOSFETs of the integrated circuit device shown in FIG. 3 are inverted. In FIG. 36, data signal transmission NMOSs, output selecting PMOSs, and a PMOS for precharging a common node $BX_1$ are denoted by reference numerals 2N-9 to 2N-12, 3P-9 to 3P-12, and 4P to correspond to the elements of the integrated circuit device shown in FIG. 3, and a detailed description thereof will be omitted.

Figure 37:
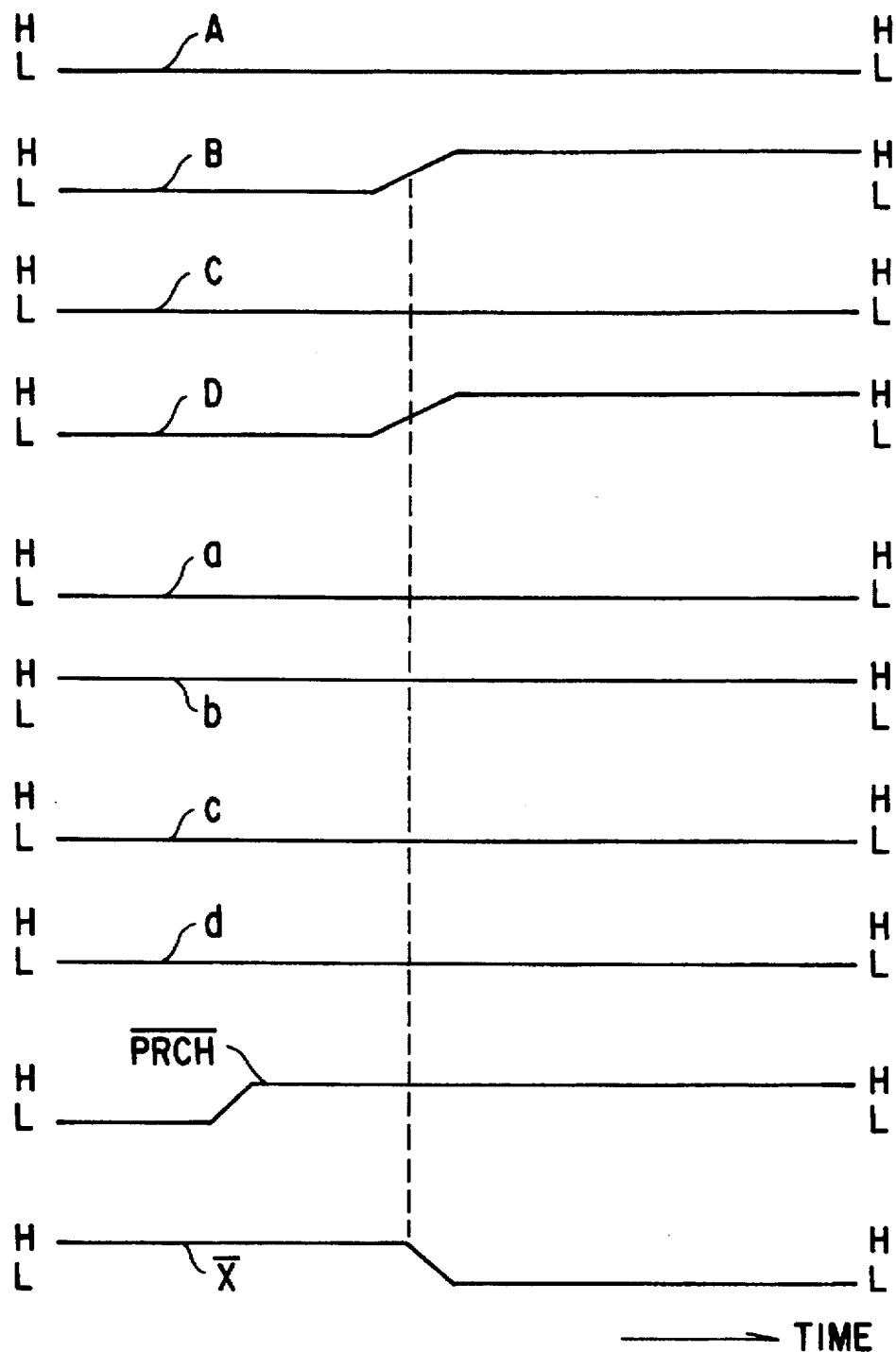
FIG. 37 is a chart showing the operating waveforms of the semiconductor integrated circuit device according to the sixth embodiment of the present invention.

The operational principle and advantages of the device according to the sixth embodiment are the same as those of the first embodiment. FIG. 37 is a chart of operating waveforms showing the operation of the device according to the sixth embodiment.

A semiconductor integrated circuit device according to the seventh embodiment of the present invention will be described below.

Figure 38:
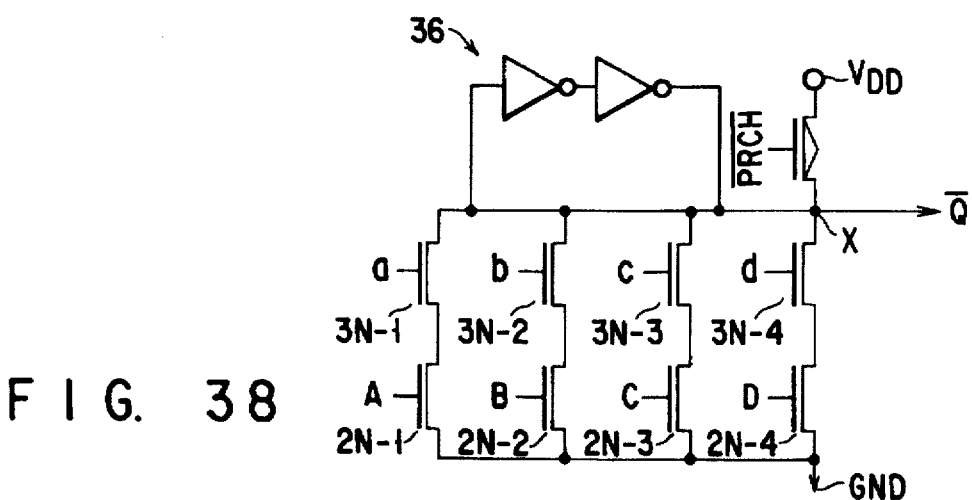
FIG. 38 is a circuit diagram of a semiconductor integrated circuit device according to the seventh embodiment of the present invention.

FIG. 38 is a circuit diagram of the semiconductor integrated circuit device according to the seventh embodiment of the present invention.

In the device according to the seventh embodiment shown in FIG. 38, a small latch circuit 36 shown in FIG. 35 is added to a common node X shown in FIG. 36.

The operational principle and advantages of the device according to the seventh embodiment are the same as those of the first embodiment, and effects of stabilizing the operation and preventing an erroneous operation, which are obtained in the device according to the fifth embodiment shown in FIG. 35, can be obtained.

According to the present invention described in the above embodiments, the influence of the parasitic capacitance can be decreased to select a plurality of data and transmit the data to the subsequent stage. Additionally, the transmission threshold can be set low, thereby allowing high-speed transmission. Especially, as the number of to-be-selected data increases, a larger effect is obtained.

In the test operation mode of the DRAM or the like, it can be determined whether a plurality of readout data are identical or different without changing the selecting circuit for a normal operation mode. For this reason, with a compact test mode circuit, an ideal test circuit in which the access time does not change between the normal operation and the test operation can be realized.

As has been described above, according to the present invention, a semiconductor integrated circuit device capable of operating at a high speed even when the number of to-be-selected data is large can be provided.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor integrated circuit device comprising:
   a first power supply terminal;
   a second power supply terminal;
   a data selecting circuit connected to said first power supply terminal and having at least first and second data transmission circuits, said first data transmission circuit receiving a first selecting signal and a first input data signal, and said second data transmission circuit receiving a second selecting signal and a second input data signal, wherein, during an active period of said semiconductor integrated circuit device in which said first data transmission circuit is selected by the first selecting signal, an initial potential level transition of the first selecting signal begins before an initial potential level transition of the first input data signal, and wherein, during an active period of said semiconductor integrated circuit device in which said second data transmission circuit is selected by the second selecting signal, an initial potential level transition of the second selecting signal begins before an initial potential level transition of the second input data signal;
   a precharge circuit, connected to said second power supply terminal, for receiving a precharge signal; and
   a wiring line connected to a common node between said data selecting circuit and said precharge circuit.

2. A device according to claim 1, wherein said first and second data transmission circuits transmit the first and second input data signals to said common node on the basis of the first and second selecting signals.

3. A device according to claim 2, wherein a potential of the first selecting signal of a first level is supplied to said first data transmission circuit, a potential of the second selecting signal of a second level different from the first level is supplied to said second data transmission circuit, and one of the first and second input data signals is transmitted to said common node.

4. A device according to claim 2, wherein potentials of the first and second selecting signals of the same level are supplied to said first and second data transmission circuits, and a logical OR signal of the first and second input data signals is transmitted to said common node.

5. A device according to claim 2, wherein when a potential of the first selecting signal of a first level is supplied to said first data transmission circuit and a potential of the second selecting signal of a second level different from the first level is supplied to said second data transmission circuit, one of the first and second input data signals is transmitted to said common node, and when potentials of the first and second selecting signals of the same level are supplied to said first and second data transmission circuits, a logical OR signal of the first and second input data signals is transmitted to said common node.

6. A device according to claim 2, wherein said common node is precharged by said precharge circuit after the first and second input data signals are transmitted to said common node.

7. A device according to claim 1, wherein said first data transmission circuit includes a first insulated gate FET for receiving the first input data signal through a gate, and a second insulated gate FET, connected in series with said first insulated gate FET, for receiving the first selecting signal through a gate, and
said second data transmission circuit includes a third insulated gate FET for receiving the second input data signal through a gate, and a fourth insulated gate FET, connected in series with said third insulated gate FET, for receiving the second input data signal through a gate.

8. A device according to claim 7, wherein said first insulated gate FET, said second insulated gate FET, said third insulated gate FET, and said fourth insulated gate FET are p-channel FETs.

9. A device according to claim 7, wherein said first and second data transmission circuits transmit the first and second input data signals to said common node on the basis of the first and second selecting signals.

10. A device according to claim 9, wherein a potential of the first selecting signal of a first level is supplied to said first data transmission circuit, a potential of the second selecting signal of a second level different from the first level is supplied to said second data transmission circuit, and one of the first and second input data signals is transmitted to said common node.

11. A device according to claim 9, wherein potentials of the first and second selecting signals of the same level are supplied to said first and second data transmission circuits, and a logical OR signal of the first and second input data signals is transmitted to said common node.

12. A device according to claim 9, wherein when a potential of the first selecting signal of a first level is supplied to said first data transmission circuit and a potential of the second selecting signal of a second level different from the first level is supplied to said second data transmission circuit, one of the first and second input data signals is transmitted to said common node, and when potentials of the first and second selecting signals of the same level are supplied to said first and second data transmission circuits, a logical OR signal of the first and second input data signals is transmitted to said common node.

13. A device according to claim 9, wherein said common node is precharged by said precharge circuit after the first and second input data signals are transmitted to said common node.

14. A device according to claim 1, further comprising:
   a potential fixing circuit, connected to said common node, for fixing a potential of said common node at a predetermined potential.

15. A device according to claim 14, wherein said potential fixing circuit is a latch circuit.

16. A device according to claim 15, wherein said first and second data transmission circuits transmit the first and second input data signals to said common node on the basis of the first and second selecting signals.

17. A device according to claim 16, wherein a potential of the first selecting signal of a first level is supplied to said first data transmission circuit, a potential of the second selecting signal of a second level different from the first level is supplied to said second data transmission circuit, and one of the first and second input data signals is transmitted to said common node.

18. A device according to claim 16, wherein potentials of the first and second selecting signals of the same level are supplied to said first and second data transmission circuits, and a logical OR signal of the first and second input data signals is transmitted to said common node.

19. A device according to claim 16, wherein when a potential of the first selecting signal of a first level is supplied to said first data transmission circuit and a potential of the second selecting signal of a second level different from the first level is supplied to said second data transmission circuit, one of the first and second input data signals is transmitted to said common node, and when potentials of the first and second selecting signals of the same level are supplied to said first and second data transmission circuits, a logical OR signal of the first and second input data signals is transmitted to said common node.

20. A device according to claim 16, wherein said common node is precharged by said precharge circuit after the first and second input data signals are transmitted to said common node.

21. A device according to claim 15, wherein said first data transmission circuit includes a first insulated gate FET for receiving the first input data signal through a gate, and a second insulated gate FET, connected in series with said first insulated gate FET, for receiving the first selecting signal through a gate, and said second data transmission circuit includes a third insulated gate FET for receiving the second input data signal through a gate, and a fourth insulated gate FET, connected in series with said third insulated gate FET, for receiving the second input data signal through a gate.

22. A device according to claim 21, wherein said first insulated gate FET, said second insulated gate FET, said third insulated gate FET, and said fourth insulated gate FET are p-channel FETs.

23. A device according to claim 21, wherein said first and second data transmission circuits transmit the first and second input data signals to said common node on the basis of the first and second selecting signals.

24. A device according to claim 23, wherein a potential of the first selecting signal of a first level is supplied to said first data transmission circuit, a potential of the second selecting signal of a second level different from the first level is supplied to said second data transmission circuit, and one of the first and second input data signals is transmitted to said common node.

25. A device according to claim 23, wherein potentials of the first and second selecting signals of the same level are supplied to said first and second data transmission circuits, and a logical OR signal of the first and second input data signals is transmitted to said common node.

26. A device according to claim 23, wherein when a potential of the first selecting signal of a first level is supplied to said first data transmission circuit and a potential of the second selecting signal of a second level different from the first level is supplied to said second data transmission circuit, one of the first and second input data signals is transmitted to said common node, and when potentials of the first and second selecting signals of the same level are supplied to said first and second data transmission circuits, a logical OR signal of the first and second input data signals is transmitted to said common node.

27. A device according to claim 23, wherein said common node is precharged by said precharge circuit after the first and second input data signals are transmitted to said common node.

28. A semiconductor integrated circuit device comprising:
a first power supply terminal;
a second power supply terminal;
a data selecting circuit connected to said first power supply terminal and having at least first and second data transmission circuits, said first data transmission circuit receiving a first input data signal and a first selection signal, and said second data transmission circuit receiving a second input data signal and a second selecting signal;
a precharge circuit, connected to said second power supply terminal, for receiving a precharge signal; and
a wiring line connected to a common node between said data selecting circuit and said precharge circuit,
wherein said first data transmission circuit includes a first selecting gate circuit for receiving the first input data signal and the first selecting signal, and a first insulated gate FET for receiving an output from said first selecting gate circuit through a gate, and said second data transmission circuit includes a second selecting gate circuit for receiving the second input data signal and the second selecting signal, and a second insulated gate FET for receiving an output from said second selecting gate circuit through a gate.

29. A device according to claim 28, wherein said first selecting gate circuit transmits the first input data signal to said first insulated gate FET on the basis of the first selecting signal, and said second selecting gate circuit transmits the second input data signal to said second insulated gate FET on the basis of the first selecting signal.

30. A device according to claim 29, wherein said first and second insulated gate FETs transmit the first and second input data signals, which are transmitted to said gates, to said common node.

31. A device according to claim 28, wherein said first insulated gate FET and said second insulated gate FET are p-channel FETs.

32. A device according to claim 30, wherein a potential of the first selecting signal of a first level is supplied to said first selecting gate circuit, a potential of the second selecting signal of a second level different from the first level is supplied to said second selecting gate circuit, and one of the first and second input data signals is transmitted to said common node.

33. A device according to claim 30, wherein potentials of the first and second selecting signals of the same level are supplied to said first and second selecting gate circuits, and a logical OR signal of the first and second input data signals is transmitted to said common node.

34. A device according to claim 30, wherein when a potential of the first selecting signal of a first level is supplied to said first selecting gate circuit and a potential of the second selecting signal of a second level different from the first level is supplied to said second selecting gate circuit, one of the first and second input data signals is transmitted to said common node, and when potentials of the first and second selecting signals of the same level are supplied to said first and second selecting gate circuits, a logical OR signal of the first and second input data signals is transmitted to said common node.

35. A device according to claim 30, wherein said common node is precharged by said precharge circuit after the first and second input data signals are transmitted to said common node.

36. A device according to claim 28, further comprising:

a potential fixing circuit, connected to said common node, for fixing a potential of said common node at a predetermined potential.

37. A device according to claim 36, wherein said potential fixing circuit is a latch circuit.

38. A device according to claim 37, wherein said first selecting gate circuit transmits the first input data signal to said first insulated gate FET on the basis of the first selecting signal, and said second selecting gate circuit transmits the second input data signal to said second insulated gate FET on the basis of the first selecting signal.

39. A device according to claim 38, wherein said first and second insulated gate FETs transmit the first and second input data signals, which are transmitted to said gates, to said common node.

40. A device according to claim 28, wherein said first insulated gate FET and said second insulated gate FET are p-channel FETs.

41. A device according to claim 39, wherein a potential of the first selecting signal of a first level is supplied to said first selecting gate circuit, a potential of the second selecting signal of a second level different from the first level is supplied to said second selecting gate circuit, and one of the first and second input data signals is transmitted to said common node.

42. A device according to claim 39, wherein potentials of the first and second selecting signals of the same level are supplied to said first and second selecting gate circuits, and a logical OR signal of the first and second input data signals is transmitted to said common node.

43. A device according to claim 39, wherein when a potential of the first selecting signal of a first level is supplied to said first selecting gate circuit and a potential of the second selecting signal of a second level different from the first level is supplied to said second selecting gate circuit, one of the first and second input data signals is transmitted to said common node, and when potentials of the first and second selecting signals of the same level are supplied to said first and second selecting gate circuits, a logical OR signal of the first and second input data signals is transmitted to said common node.

44. A device according to claim 39, wherein said common node is precharged by said precharge circuit after the first and second input data signals are transmitted to said common node.

* * * * *